(12) United States Patent
Scott et al.

(10) Patent No.: US 9,294,042 B2
(45) Date of Patent: Mar. 22, 2016

(54) POWER AMPLIFIER SYSTEM WITH SUPPLY MODULATION MITIGATION CIRCUITRY AND METHODS

(71) Applicant: RF Micro Devices (Cayman Islands), Ltd., George Town, Grand Cayman (KY)

(72) Inventors: Baker Scott, San Jose, CA (US); George Maxim, Saratoga, CA (US)

(73) Assignee: RF Micro Devices (Cayman Islands), Ltd., George Town (KY)

( * ) Notice: Subject to any disclaimer, the term of this patent is extended or adjusted under 35 U.S.C. 154(b) by 2 days.

(21) Appl. No.: 14/216,051

(22) Filed: Mar. 17, 2014

(65) Prior Publication Data

US 2014/0266444 A1    Sep. 18, 2014

Related U.S. Application Data

(60) Provisional application No. 61/793,713, filed on Mar. 15, 2013.

(51) Int. Cl.
| | |
|---|---|
| *H03F 1/30* | (2006.01) |
| *H03F 1/02* | (2006.01) |
| *H03F 3/21* | (2006.01) |
| *H03F 3/45* | (2006.01) |
| *H03F 1/26* | (2006.01) |

(52) U.S. Cl.
CPC ............... *H03F 1/30* (2013.01); *H03F 1/0227* (2013.01); *H03F 3/21* (2013.01); *H03F 3/45273* (2013.01); *H03F 1/02* (2013.01); *H03F 1/26* (2013.01); *H03F 1/305* (2013.01)

(58) Field of Classification Search
CPC ....... H03F 1/30; H03F 1/0222; H03F 1/0233; H03F 1/02; H03F 1/21; H03F 1/26; H03F 1/305; H03F 3/45273
USPC ................... 330/127, 149, 297, 264, 123, 134
See application file for complete search history.

(56) References Cited

U.S. PATENT DOCUMENTS

| | | | | |
|---|---|---|---|---|
| 6,480,705 | B1 * | 11/2002 | Kusunoki | ............... 455/126 |
| 2010/0001800 | A1 * | 1/2010 | Milkov | ............... 330/264 |
| 2011/0156814 | A1 * | 6/2011 | Krvavac et al. | ............... 330/149 |

* cited by examiner

*Primary Examiner* — Steven J Mottola
*Assistant Examiner* — Hafizur Rahman
(74) *Attorney, Agent, or Firm* — Withrow & Terranova, P.L.L.C.

(57) ABSTRACT

A power amplifier system with supply modulation mitigation circuitry and methods is disclosed. The power amplifier system includes a regulator having an unregulated input and a regulated output along with a power amplifier having a supply input for receiving a supply current from the regulated output and having a signal input and a signal output that comprise a main signal path. The supply modulation mitigation circuitry is adapted to sense a supply modulation signal output from the regulator, generate a cancellation signal that is a scaled inverse of the supply modulation signal, and inject the cancellation signal into a node within the power amplifier system to sum the supply modulation signal and cancellation signal together to reduce the supply modulation signal from within the main signal path.

28 Claims, 22 Drawing Sheets

POWER AMPLIFIER SYSTEM WITH SUPPLY MODULATION MITIGATION CIRCUITRY AND METHODS

RELATED APPLICATIONS

This application claims the benefit of U.S. provisional patent application No. 61/793,713, filed Mar. 15, 2013, the disclosure of which is incorporated herein by reference in its entirety.

FIELD OF THE DISCLOSURE

The present disclose relates to electronic communication systems and methods. In particular, the present disclosure relates to systems and methods to compensate for adjacent channel power ratio (ACPR) asymmetry due to power supply modulation.

BACKGROUND

Linear power amplifiers have supply currents that are proportional to a signal envelope. If a supply current passes through a finite series resistance, it generates a supply modulation voltage that changes the actual supply voltage provided to the power amplifier dependent on the process signal envelope of a modulated signal. One case of supply modulation occurs when a power amplifier stage is biased by a regulator having finite output impedance. If an envelope current passes through the regulator, the envelope current creates a modulated voltage that adds to the actual supply voltage at a power amplifier stage. In single ended power amplifier configurations, the supply voltage is in series with the output signal voltage and thus any supply modulation appears as distortion on the signal path. Reducing the supply modulation level requires low regulator output impedance, which results in high power consumption within the regulator. As a result, power amplifier efficiency is reduced.

In the case of high electron mobility field-effect transistor (HFET) amplifiers having an inductive load, inductor series loss resistance will also generate a supply modulation voltage when passed by a power amplifier stage's envelope current. Reducing inductor series loss resistance results in large area inductors and thus high cost. One method used by the prior art to reduce supply modulation is to use differential amplifier configurations. Any supply modulation voltage appears as a common mode voltage and is thus highly rejected when transferring to a differential output. The main drawbacks of this technique are size and cost penalties brought by a differential architecture.

Another so called brute-force technique used for prior art linear power amplifiers reduces output impedance at a regulator output through the use of a stronger feedback loop. Such techniques result in higher current consumption in the regulator, which degrades overall power amplifier efficiency performance.

Thus, a need exists for alternative supply modulation mitigation solutions that maintain high power amplifier efficiency. However, such alternative supply modulation mitigation solutions must not significantly impact die area and/or cost of the power amplifier.

SUMMARY

A power amplifier system with supply modulation mitigation circuitry and methods is disclosed. The power amplifier system includes a regulator having an unregulated input and a regulated output along with a power amplifier having a supply input for receiving a supply current from the regulated output and having a signal input and a signal output that comprise a main signal path. The supply modulation mitigation circuitry is adapted to limit leakage of a supply modulation signal into the main signal path, wherein the supply modulation signal is generated by the supply current passing through a series resistance.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

Figure 1A:
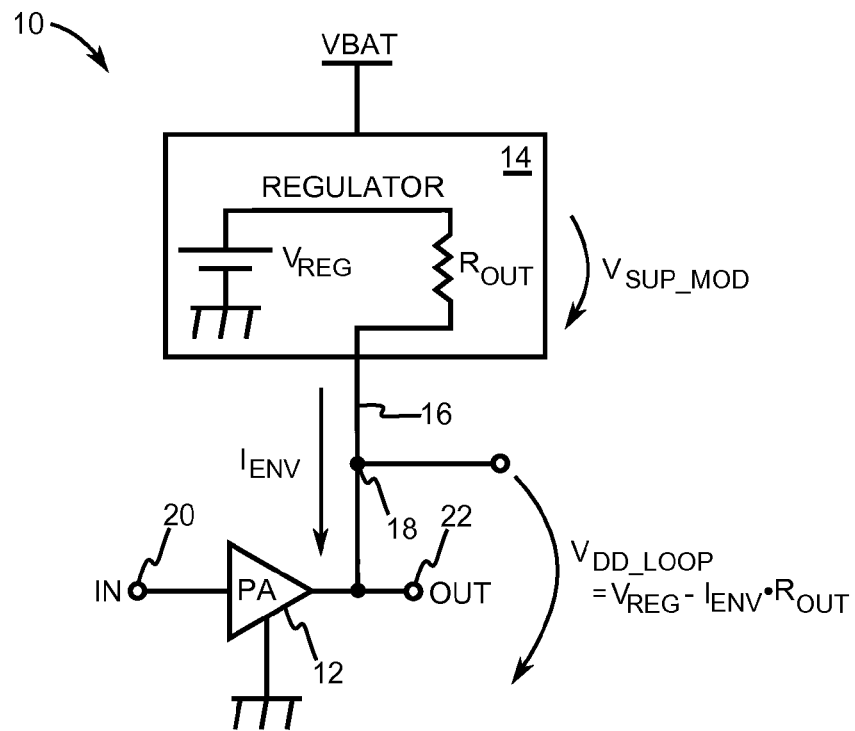
FIG. 1A depicts a prior art regulator and power amplifier system having an output resistance that results in an undesirable modulation of supply voltage.
Figure 1B:
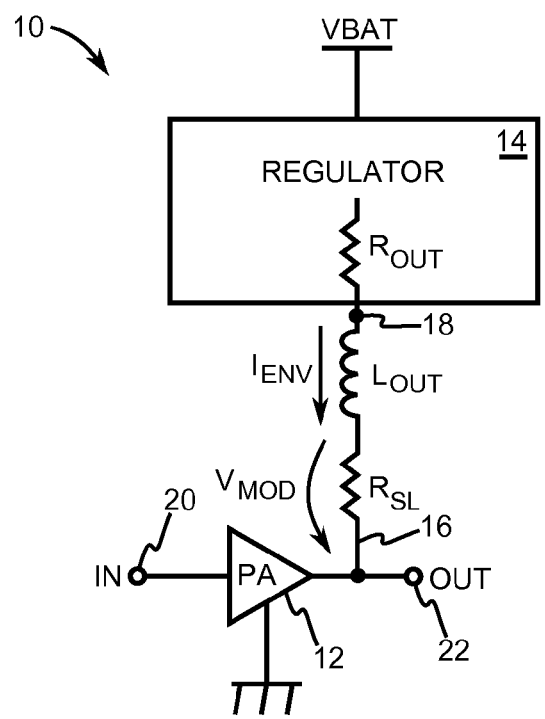
FIG. 1B depicts a prior art regulator and power amplifier system that includes an inductor having a series resistance that further results in an undesirable modulation of supply voltage.

This disclosure provides techniques that mitigate dynamic distortions in linear power amplifiers that are due to a supply modulation generated by an envelope modulation signal that is dependent upon power amplifier stage supply currents. FIG. 1A is a schematic of a prior art regulator and power amplifier system 10 having a power amplifier 12 that can at least slightly mitigate adverse effects on power amplifier performance due to a regulator supply modulation $V_{SUP\_MOD}$ of a regulator 14. In this particular case, the power amplifier 12 is single ended. The regulator supply modulation $V_{SUP\_MOD}$ reacts with a supply path 16 because single ended amplifiers use a supply node 18 as a control port. The effect of the regulator supply modulation $V_{SUP\_MOD}$ can be attenuated if a parasitic modulation is added to the supply path 16 such that the parasitic modulation appears as a common mode signal that is strongly rejected. The supply modulation can be cancelled either at an input 20 of the power amplifier 12 or at an output 22 of the power amplifier 12. When using this technique, an envelope current $I_{ENV}$ is still provided by the regulator 14, and the envelope current $I_{ENV}$ generates a supply modulation due to a voltage drop across an output resistance $R_{OUT}$ through which the envelope current $I_{ENV}$ flows. This technique does not eliminate the supply modulation. Instead, this prior art technique only attenuates the supply modulation's impact on the supply path 16. FIG. 1B depicts the prior art regulator and power amplifier system 10 wherein the power amplifier 12 further includes an inductor $L_{OUT}$ coupled between the regulator 14 and the output 22. The inductor $L_{OUT}$ includes a series resistance $R_{SL}$ that further adds to the supply modulation, which complicates attenuation of the supply modulation's impact on the supply path 16.

Figure 2A:
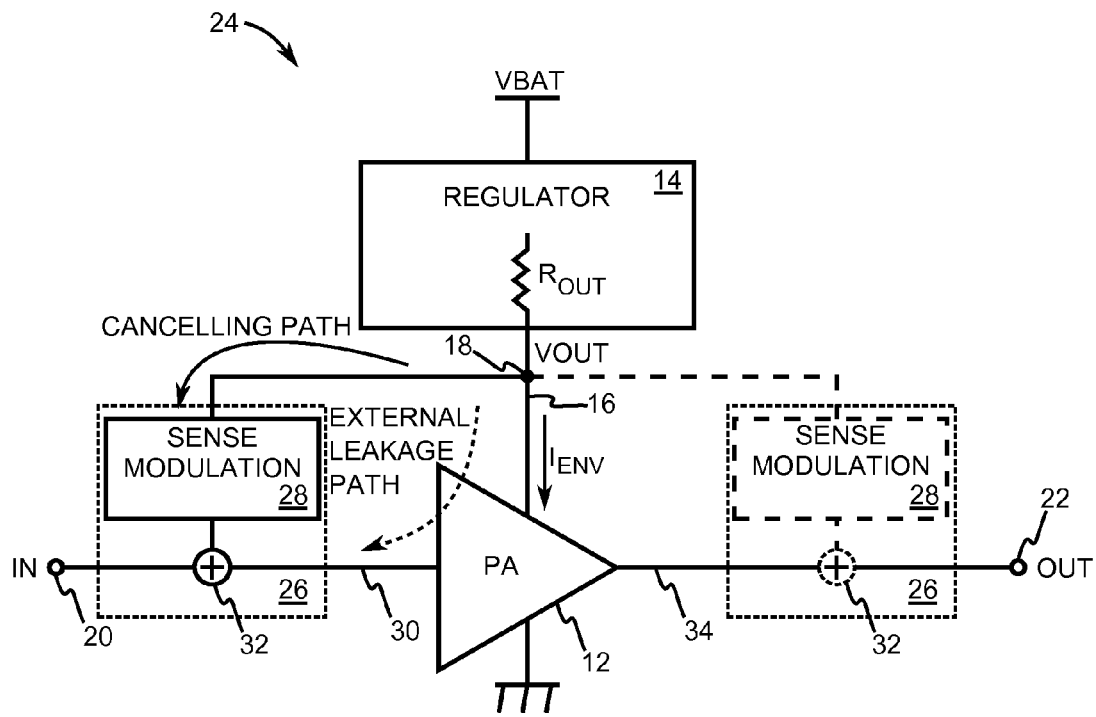
FIG. 2A depicts a regulator and power amplifier system that includes common-mode rejection circuitry for reducing undesirable modulation of supply voltage in accordance with the present disclosure.

FIG. 2A depicts a regulator and power amplifier system 24 that includes common-mode rejection circuitry 26 for reducing undesirable modulation of supply voltage in accordance with the present disclosure. A first method for eliminating supply modulation uses the common-mode rejection circuitry 26 that includes a sense modulation circuit 28 that first senses a dynamic voltage VOUT at the supply node 18. The sense modulation circuit 28 then injects a scaled copy of the dynamic voltage VOUT into an input path 30 via a summation node 32. Alternatively, the summation node 32 can be located on an output path 34. In this way, the common-mode rejection circuitry 26 can be applied to the output of the power amplifier 12. However, in most cases, a different scale is typically used for the scaled copy of the dynamic voltage VOUT applied to the output path 34. In either case, an external leakage path shown in dashed line for supply modulation is countered by a supply modulation cancelling path shown in solid line.

Figure 2B:
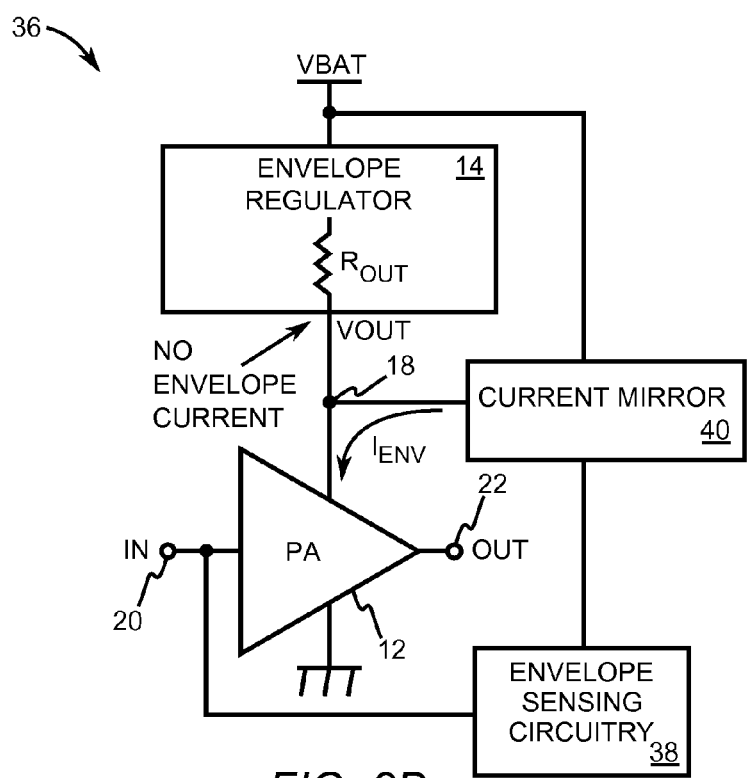
FIG. 2B depicts a regulator and power amplifier system that includes neutralization circuitry for eliminating undesirable modulation of supply voltage in accordance with the present disclosure.

FIG. 2B is an embodiment of a regulator and power amplifier system 36 that practically eliminates the supply modulation before undesirable effects are generated by avoiding the passage of the envelope current $I_{ENV}$ through the regulator's output impedance, which in this case is predominately the output resistance $R_{OUT}$. In order to reject the supply modulation before undesirable effects are generated, the envelope signal is first sensed by envelope sensing circuitry 38, and in turn a current mirror 40 with a scaled gain injects into the supply node 18 a current that relatively closely matches an envelope current $I_{ENV}$ required by the power amplifier 12. In this way, the output resistance $R_{OUT}$ is not passed by the envelope current $I_{ENV}$, thus avoiding generation of a supply modulation. Choosing one of these two techniques of supply modulation mitigation depends on the structure of the power amplifier 12 and the degree to which the supply modulation needs to be rejected.

Figure 3:
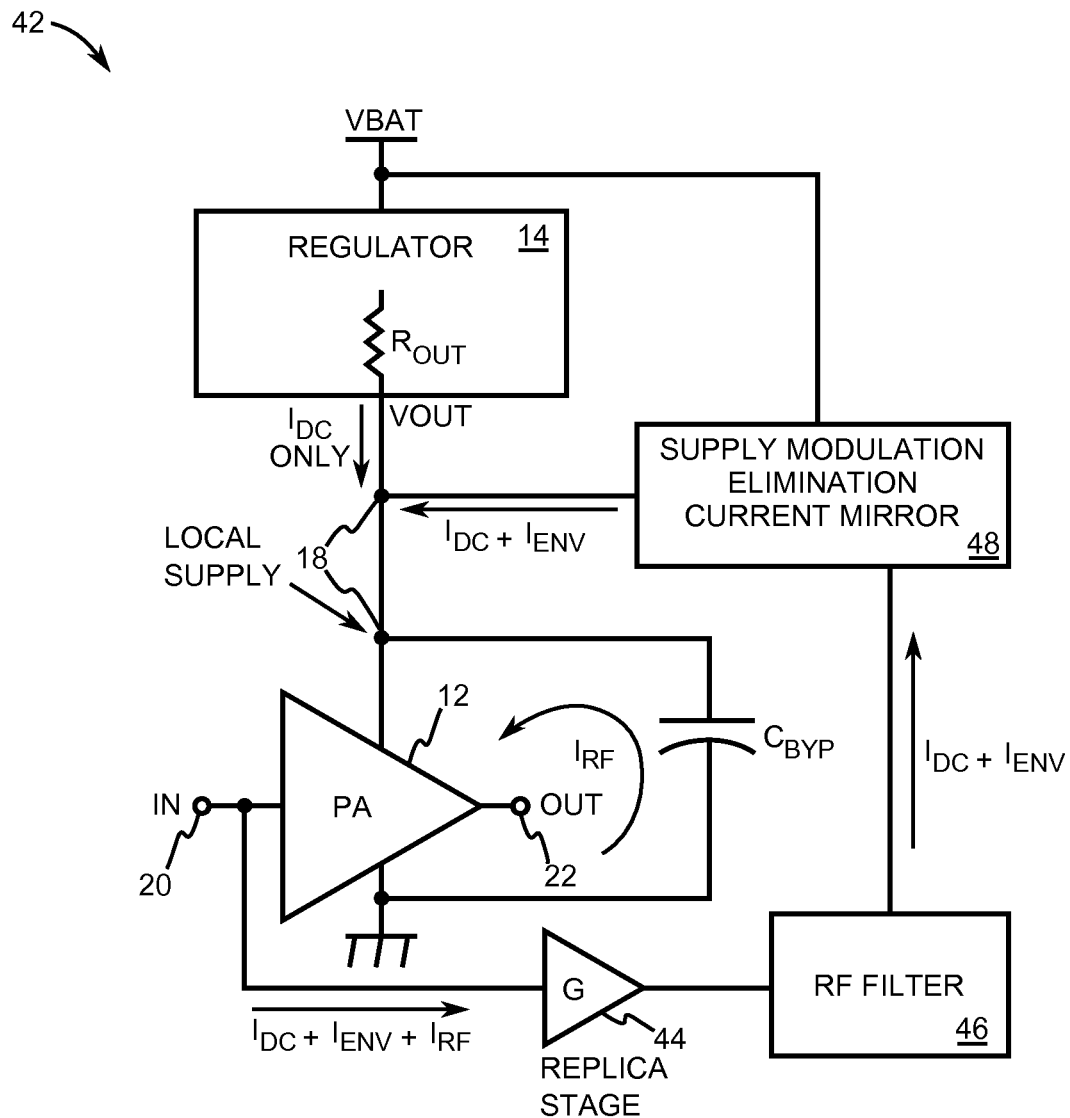
FIG. 3 is a principle of operation diagram for supply modulation neutralization for exemplary embodiments that route modulation currents away from the series resistance.

FIG. 3 is a schematic of a regulator and power amplifier system 42 that uses another supply modulation rejection technique. A relatively small replica stage 44 that matches closely a main signal path amplifier, with the exception that it operates at much lower signal power, is used to create a copy of a total current flowing through the power amplifier 12, including a direct current $I_{DC}$, an RF current $I_{RF}$ and an envelope current $I_{ENV}$. An RF filter 46 is used to eliminate the RF current $I_{RF}$ through, for example, low pass filtering, leaving only the direct current $I_{DC}$ and the envelope current $I_{ENV}$. A supply modulation elimination current mirror 48 is used to inject back into the supply node 18 an amplified DC current $I_{DC}$ and the envelope current $I_{ENV}$ that matches the current required by the power amplifier 12. In this way, the regulator 14 needs to provide only a DC current component for the supporting bias circuitry and any mismatch current between the mirror current and the stage current. The RF current is primarily provided by the bypass capacitor $C_{BYP}$ of the power amplifier 12. In this way, the regulator output resistance $R_{OUT}$ is not passed by the envelope current $I_{ENV}$. The regulator requirements in terms of bandwidth and output impedance are significantly relaxed, allowing some power saving in the regulator 14. This power saving more than balances the current needed to operate the envelope sensing path that includes the replica stage 44.

Figure 4A:
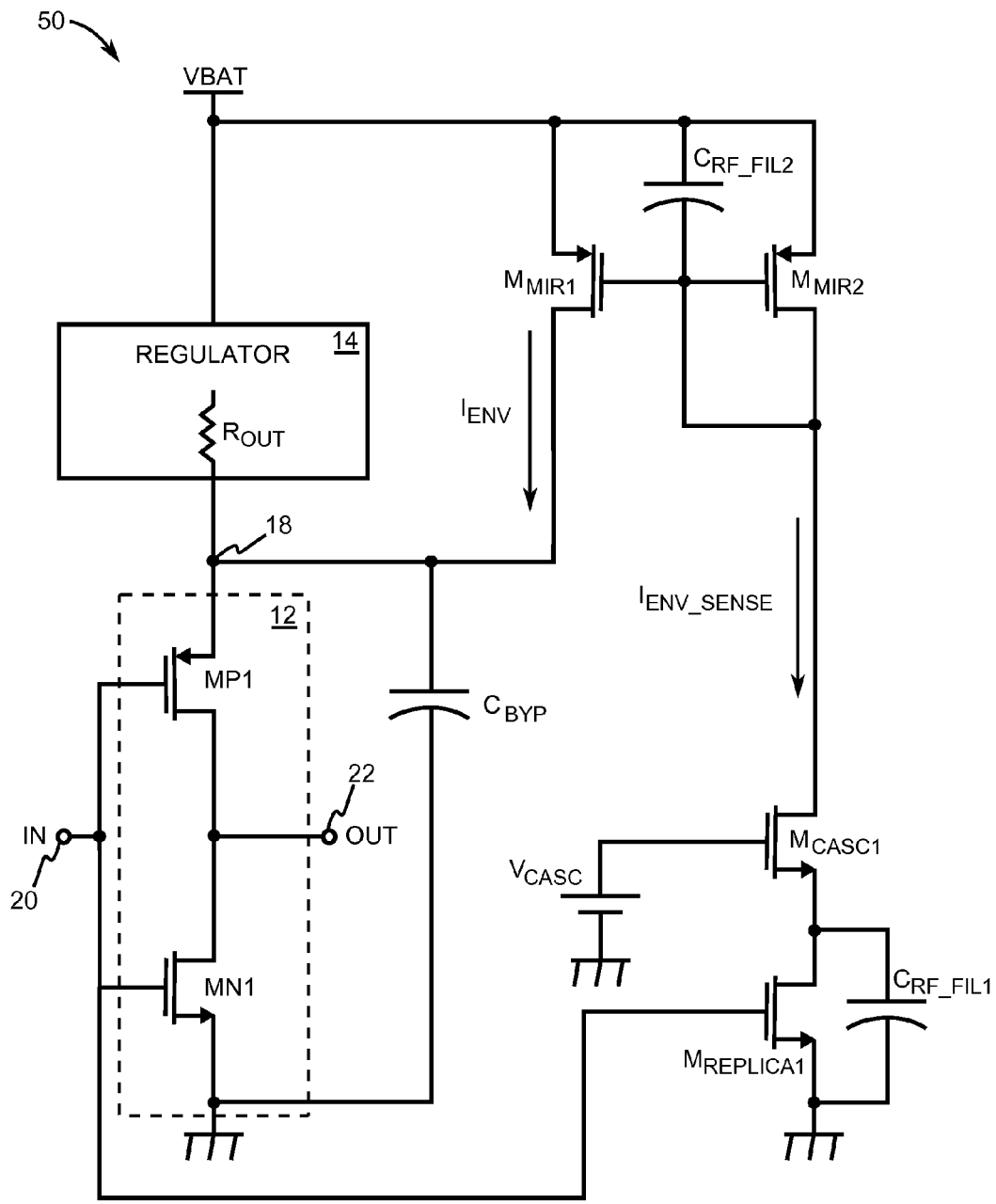
FIG. 4A is a schematic of a complementary metal oxide semiconductor (CMOS) stage that includes a relatively small size replica device that is used to generate a copy of an amplifier total current that is usable to reject supply modulation.
Figure 4B:
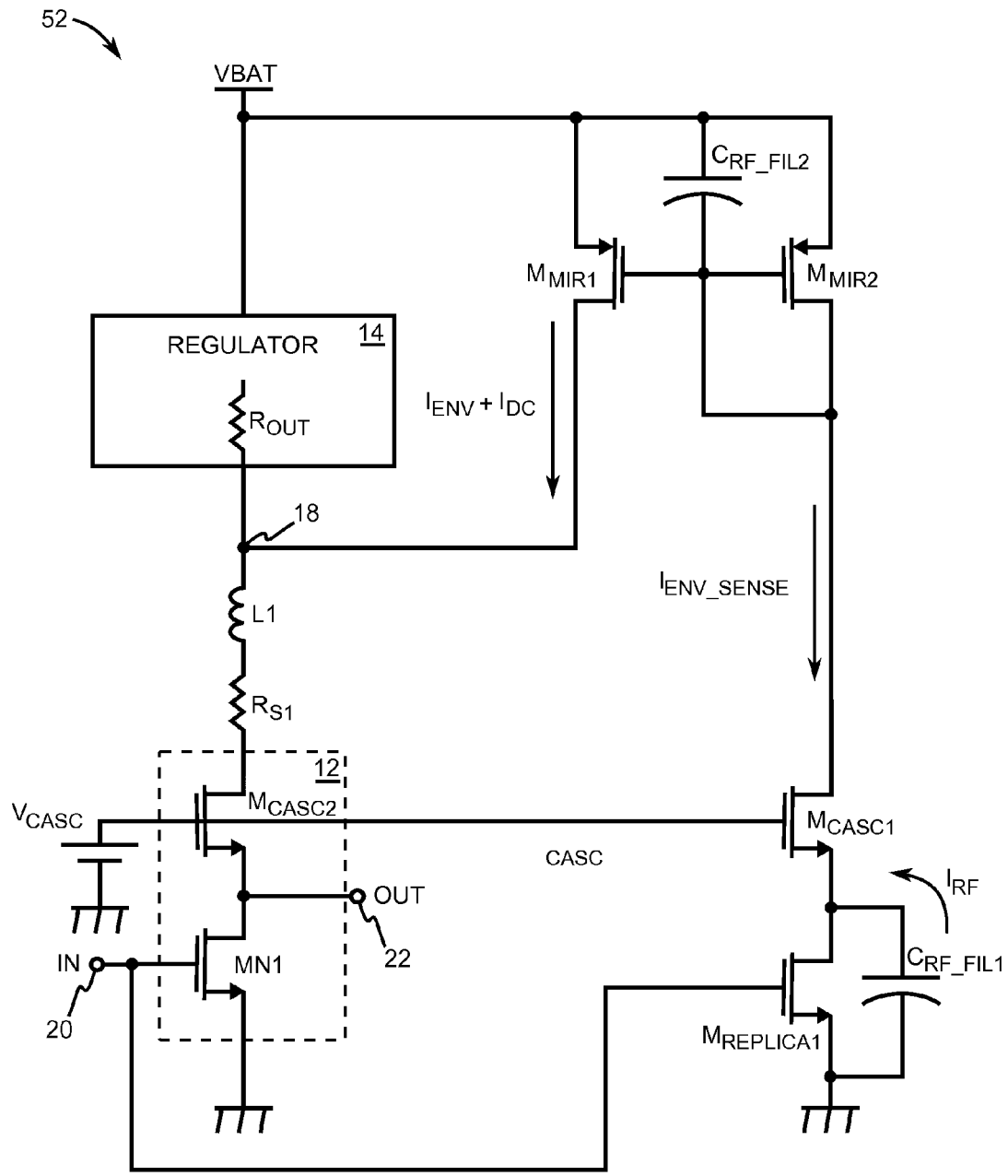
FIG. 4B is a schematic of a high density metal oxide semiconductor (HMOS) stage that includes a relatively small size replica device that is used to generate a copy of an amplifier total current that is usable to reject supply modulation.

FIGS. 4A and 4B show two transistor level embodiments of regulator and power amplifier systems for a supply modulation technique applied to complementary metal oxide semiconductor (CMOS) stages shown in FIG. 4A and high density metal oxide semiconductor (HMOS) stages depicted in FIG. 4B, respectively. In the case of a CMOS amplifier system 50, the envelope current $I_{ENV}$ passes through both an NFET device MN1 and a PFET device MP1. A small size replica device $M_{REPLICA1}$ that relatively closely matches current density in the main signal path device, which in this case is the NFET device MN1, is used to generate a copy of the amplifier total current $I_{DC}+I_{RF}+I_{ENV}$. A residual RF current is filtered by the first capacitor $C_{RF\_FIL1}$, while a cascode transistor $M_{CASC1}$ keeps the average drain to source voltage of the small size replica device $M_{REPLICA1}$ close to the drain to source voltage of the NFET device MN1. A bias voltage $V_{CASC}$ sets a bias for the cascode transistor $M_{CASC1}$. A PFET current mirror made up of a first mirror device $M_{MIR1}$ and a second mirror device $M_{MIR2}$ biased from a global supply VBAT, amplifies the sensed envelope and DC currents to make the envelope current $I_{ENV}$ required by the power amplifier 12. A residual RF current can be further attenuated with a second filtering via a second capacitor $C_{RF\_FIL2}$. To conserve high power amplifier efficiency, an envelope sense current $I_{ENV\_SENSE}$ should be on the order of 20 to 100 times smaller than the total current flowing through the power amplifier 12. In FIG. 4A, the envelope current $I_{ENV}$ is sensed from the NFET device MN1 of the power amplifier 12. However, it is to be understood that a similar supply modulation rejection technique can be implemented by sensing the envelope current $I_{ENV}$ from the PFET device MP1 of the power amplifier 12.

In FIG. 4B the supply modulation elimination technique is applied to the power amplifier 12 having an inductive load made up of an inductor L1 that is typically a power inductor. In this particular embodiment, the PFET device MP1 (FIG. 4A) is replaced by a second cascode transistor $M_{CASC2}$. Similar to the operation of the embodiment of FIG. 4A, a replica current is created by the small size replica device $M_{REPLICA1}$ while the RF current $I_{RF}$ is filtered by the first capacitor $C_{RF\_FIL1}$. A sensed envelope current $I_{ENV\_SENSE}$ together with a scaled-down DC current are injected into the supply modulation elimination current mirror made up of the first mirror device $M_{MIR1}$ and the second mirror device $M_{MIR2}$, which amplifies the envelope current $I_{ENV}$ and direct current $I_{DC}$ to the level needed to supply the required envelope and DC currents to the power amplifier 12.

This technique avoids the supply modulation due to the regulator's finite output impedance. However, this configuration does not reject the supply modulation generated as the envelope current $I_{ENV}$ flows through a series loss resistance $R_{S1}$ of the inductor L1. A high-quality inductor having a low loss resistance is needed to keep the supply modulation at a desirably low level. Typically, a high-quality inductor with a large area that increases die area and cost is needed.

Figure 5:
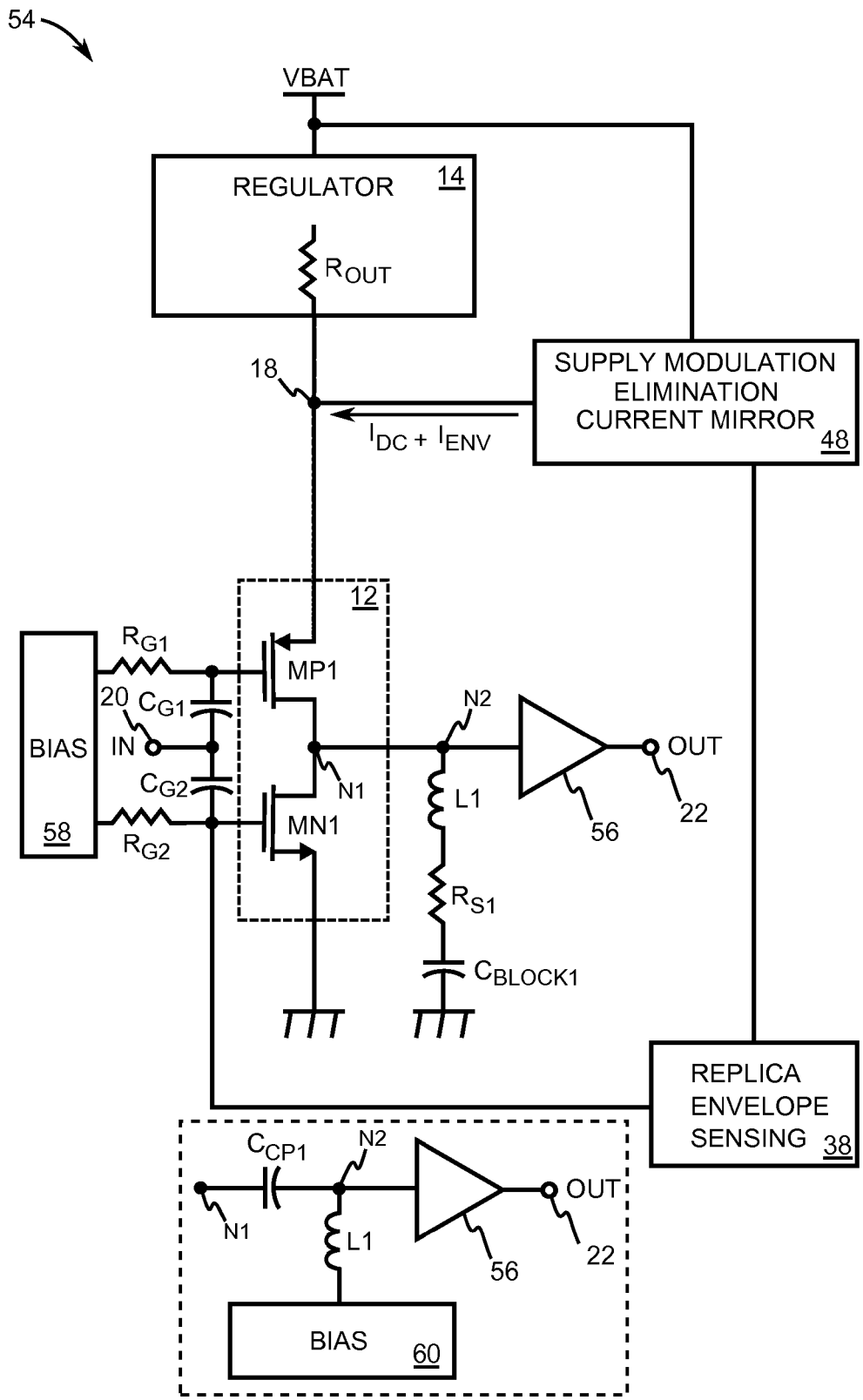
FIG. 5 is a schematic of a CMOS stage that rejects a supply modulation due to current flowing through a series loss resistance of an inductor.

FIG. 5 is a schematic of a CMOS stage 54 that rejects the supply modulation due to current flowing through the series loss resistance $R_{S1}$ of inductor L1. In this case, the envelope current $I_{ENV}$ does not flow through the inductor L1, and thus does not create supply modulation through the series loss resistance $R_{S1}$ of inductor L1. As a result, CMOS stage 54 allows the use of small area, lower quality factor inductors, which results in low die area consumption and thus lower cost.

Both DC and AC coupling can be used between the power amplifier 12 and an output amplifier stage 56. The inductor L1 allows only RF current flow to ground due to a series DC blocking capacitor $C_{BLOCK1}$. In this case, the supply modulation elimination works best since the single supply modulation is primarily due to current flowing through the regulator's output impedance $Z_{OUT}$. In this particular embodiment, the power amplifier 12 is biased for linear operation via a bias block 58 that is DC coupled to gates of the PFET device MP1 and the NFET device MN1 through gate resistors $R_{G1}$ and $R_{G2}$. Moreover, input coupling capacitors $C_{G1}$ and $C_{G2}$ couple RF signals to the gates of PFET device MP1 and NFET device MN1. An optional bias block 60 can be added to provide bias for the output amplifier stage 56 if AC coupling with the power amplifier 12 is desirable. This option is shown in an outset bounded by dashed lines. In this case, a coupling capacitor $C_{CP1}$ is connected between a node N1 of the power amplifier 12 and an input node N2 of the output amplifier stage 56.

In some cases, the use of CMOS stages with inductor loads may not be possible. For example, when a very large signal swing is needed, such as a signal larger than the supply voltage, the use of CMOS stages with inductor loads is at least problematic. If an NFET amplifier is mandatory, the envelope current $I_{ENV}$ will flow through the inductor L1 and the series loss resistance $R_{S1}$ will create some positive supply modulation that is not eliminated by the supply modulation elimination current mirror 48. However, an inductor-generated supply modulation is rejected because the envelope current $I_{ENV}$ is injected into the supply node 18 by the supply modulation elimination current mirror 48.

Figure 6:
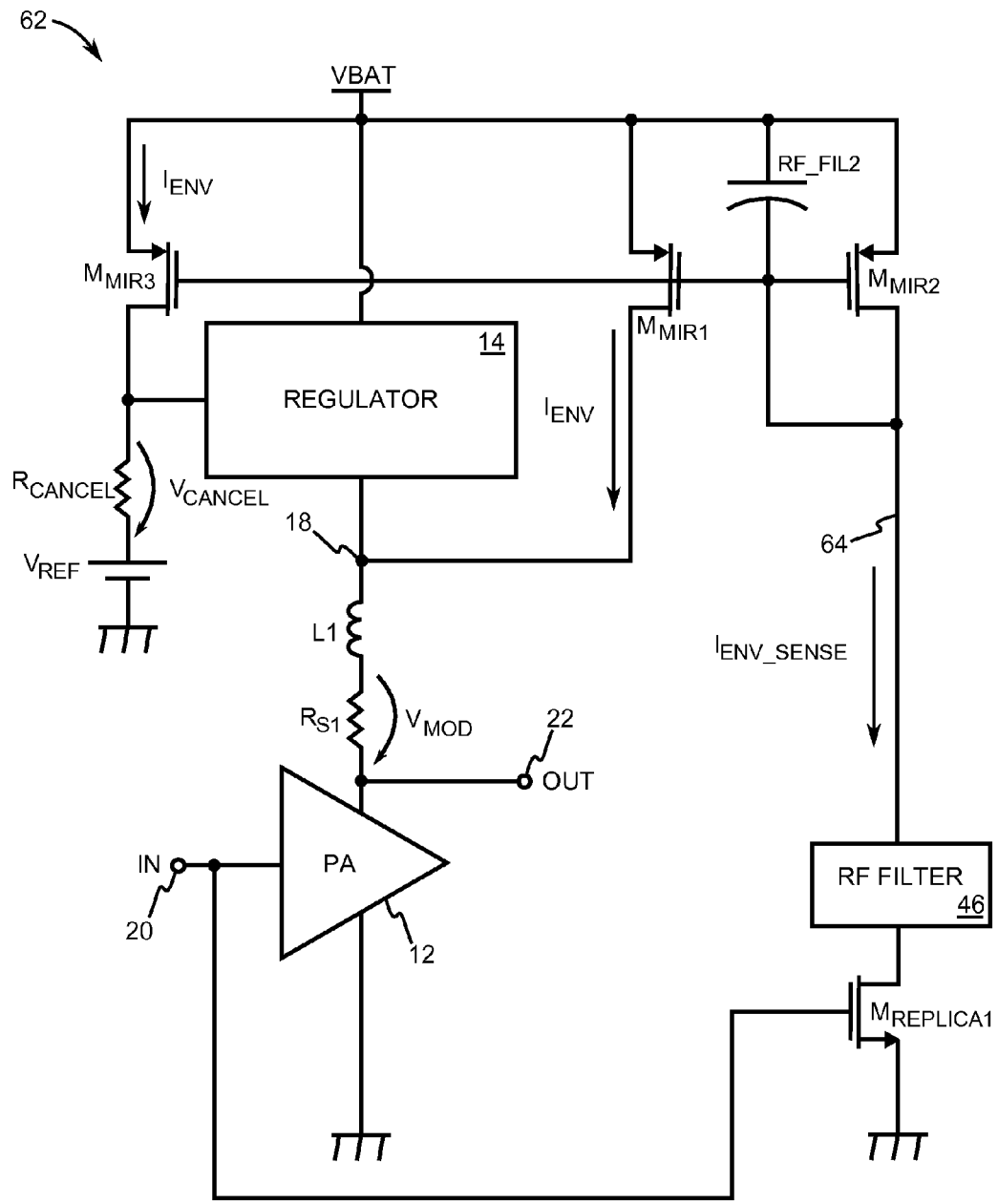
FIG. 6 is a schematic of a regulator and power amplifier system that provides a solution for CMOS stages having inductive loads.

FIG. 6 is a schematic of a regulator and power amplifier system 62 that provides a solution for CMOS stages having inductive loads. The regulator and power amplifier system 62 uses a third mirror device $M_{MIR3}$ to inject a copy of the envelope current $I_{ENV}$ into a supply modulation cancellation resistor $R_{CANCEL}$ that is connected in series with a reference voltage $V_{REF}$ that is provided for the regulator 14. As such, a $V_{CANCEL}=I_{ENV}*R_{CANCEL}$ modulation voltage is added to a DC reference voltage $V_{REF\_DC}$ in order to cancel an inductor internal bias modulation voltage $V_{MOD}=I_{ENV}*R_{S1}$.

Other implementations of similar inductor bias modulation cancellation techniques are possible. Most of these other implementations use an estimated series loss resistance $R_{S1}$ and a sensed envelope current $I_{ENV\_SENSE}$ that flows through a replica envelope sensing leg 64. However, it is possible to realize the supply modulation elimination without using the replica envelope sensing leg 64. In this way, any efficiency loss due to the replica envelope sensing leg 64 is avoided.

Figure 7:
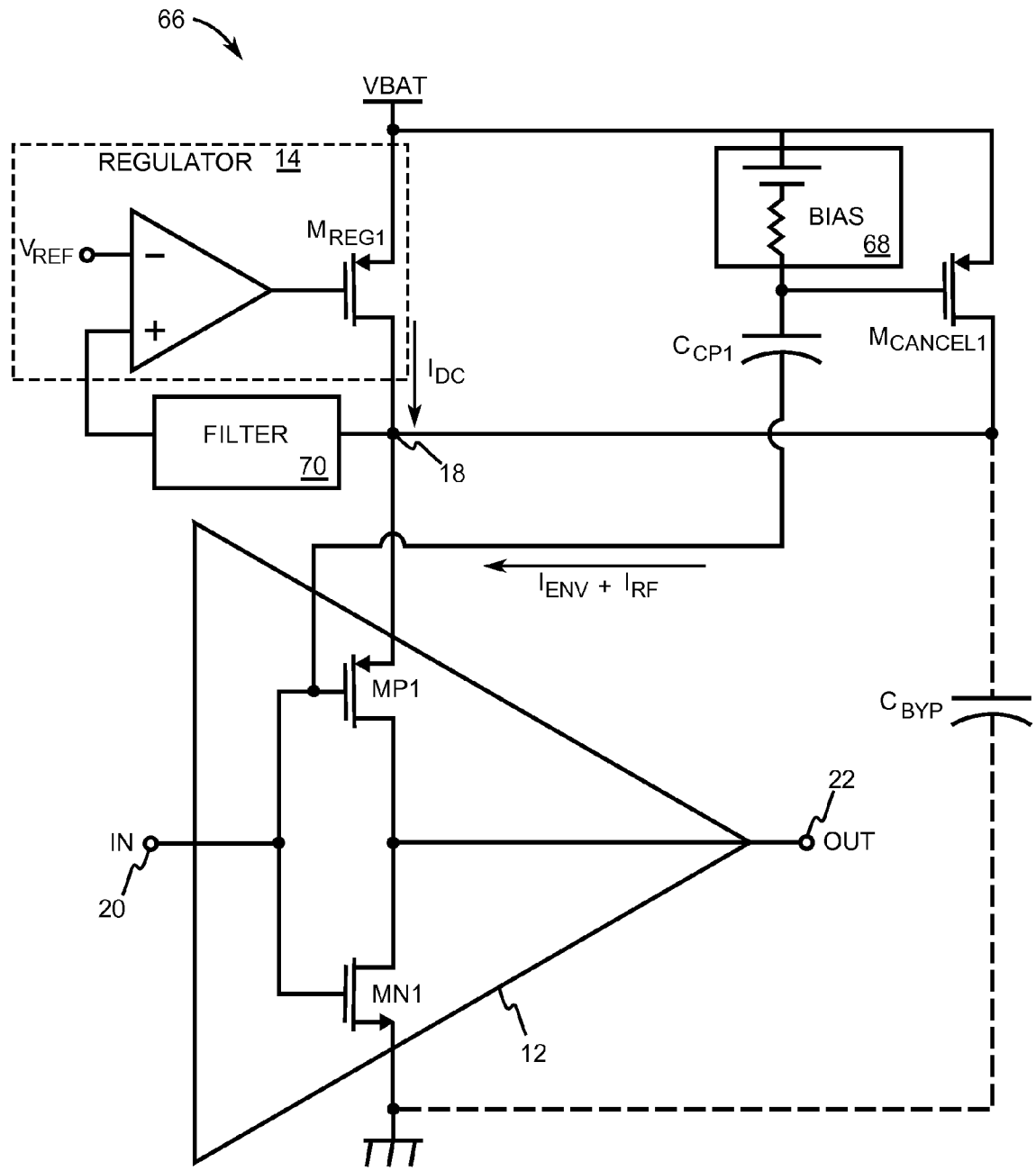
FIG. 7 is a schematic of a regulator and power amplifier system embodiment that realizes power supply rejection with increased efficiency due to an elimination of a replica envelope sensing leg depicted in FIG. 6.

FIG. 7 is a schematic of a regulator and power amplifier system 66 that realizes power supply rejection with increased efficiency due to an elimination of the replica envelope sensing leg 64 (FIG. 6). This particular embodiment uses the envelope signal sensing from the PFET device MP1 of the power amplifier 12. A supply modulation PFET $M_{CANCEL1}$ biased from the global supply VBAT via a bias circuit 68 is used to inject the envelope current $I_{ENV}$ needed by the power amplifier 12. A coupling capacitor $C_{Cp1}$ couples the gate of the PFET device MP1 to the supply modulation PFET $M_{CANCEL1}$. A high pass characteristic of an AC coupling circuit eliminates the DC current component and passes an AC signal made up of the RF current $I_{RF}$ and the envelope current $I_{ENV}$.

In this embodiment, the supply modulation PFET $M_{CANCEL1}$ provides both the envelope current $I_{ENV}$ and at least some of the RF current $I_{RF}$, while the regulator 14 provides only the direct current $I_{DC}$. As a result, the regulator and power amplifier system 66 uses fewer components and occupies less die area than the regulator and power amplifier system 64. However, a relatively small downside of the regulator and power amplifier system is that the supply modulation PFET $M_{CANCEL1}$ passes the RF current $I_{RF}$ of the power amplifier 12 to the global supply VBAT. As such, an undesirable RF coupling to other circuits associated with the system can be inadvertently established. In this case, the load bypass capacitor $C_{BYP}$ will not locally pass most of the RF current $I_{RF}$. A filter 70 coupled between a non-inverting input of the regulator 14 and the drain of the regulator transistor $M_{REG1}$ filters out supply modulation of the reference voltage $V_{REF}$.

A goal of the present disclosure is to improve power amplifier efficiency by relaxing regulator specifications while reducing current consumption by the regulator 14. This goal is realized by ensuring a high level of linearity for the power amplifier 12 while keeping a parasitic bias modulation that leaks into the signal path of the power amplifier 12 to a relatively low level.

Figure 8A:
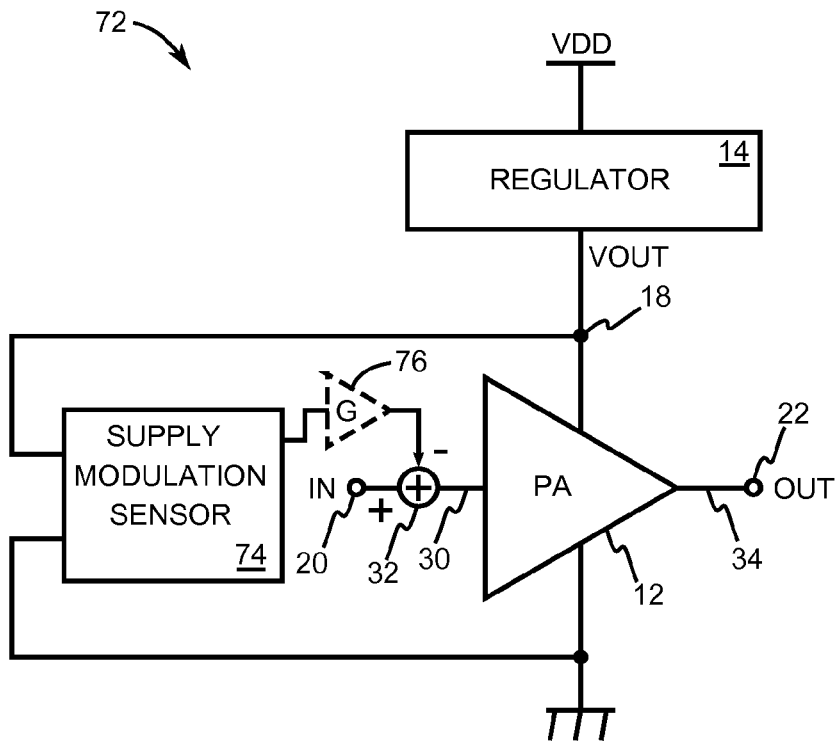
FIG. 8A is a schematic of a regulator and power amplifier system for providing a common mode rejection of supply modulation for the amplifier by injecting a cancellation signal on the input path of amplifier.

FIG. 8A is a schematic of a regulator and power amplifier system 72 for providing a common mode rejection of parasitic bias modulation affecting the power amplifier 12 by injecting a cancellation signal on the input path 30 of the power amplifier 12. Parasitic bias modulation rejection begins by sensing regulator supply modulation with a supply modulation sensor 74. The sensed modulation is then subtracted from a signal received at the input 20 via the summation node 32 located on the input path 30. Additional gain (G) can be provided by an optional gain block 76 to further reduce the power required for the supply modulation sensor 74.

Figure 8B:
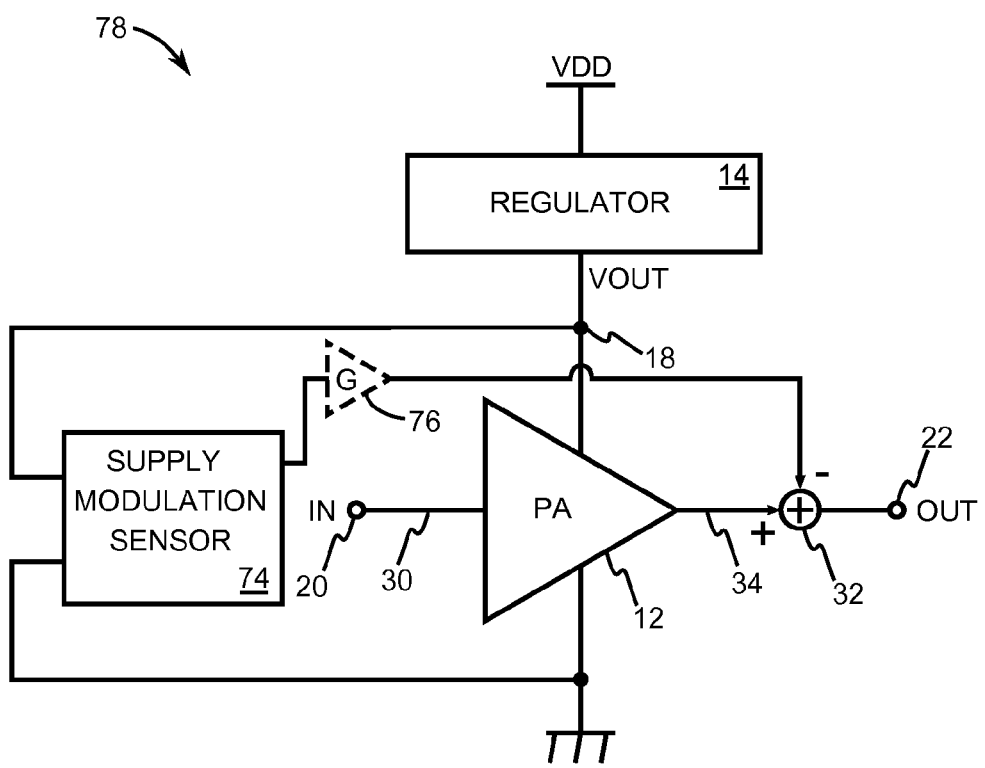
FIG. 8B is a schematic of a regulator and power amplifier system for providing a common mode rejection of parasitic bias modulation affecting the amplifier by injecting a cancellation signal on the output path of amplifier.

FIG. 8B is a schematic of a regulator and power amplifier system 78 for providing a common mode rejection of parasitic bias modulation affecting the power amplifier 12 by injecting a cancellation signal on the output path 34 of the power amplifier 12. In this embodiment, parasitic bias modulation rejection also begins by sensing regulator supply modulation with a supply modulation sensor 74. However, in this case the sensed modulation is then subtracted from a signal output at the output 22 via the summation node 32 located on the output path 34. Signal processing using the supply modulation sensor 74 can be performed either in a voltage mode or in a current mode for both of the regulator and power amplifier systems 72 and 74 (FIGS. 8A and 8B).

Figure 9A:
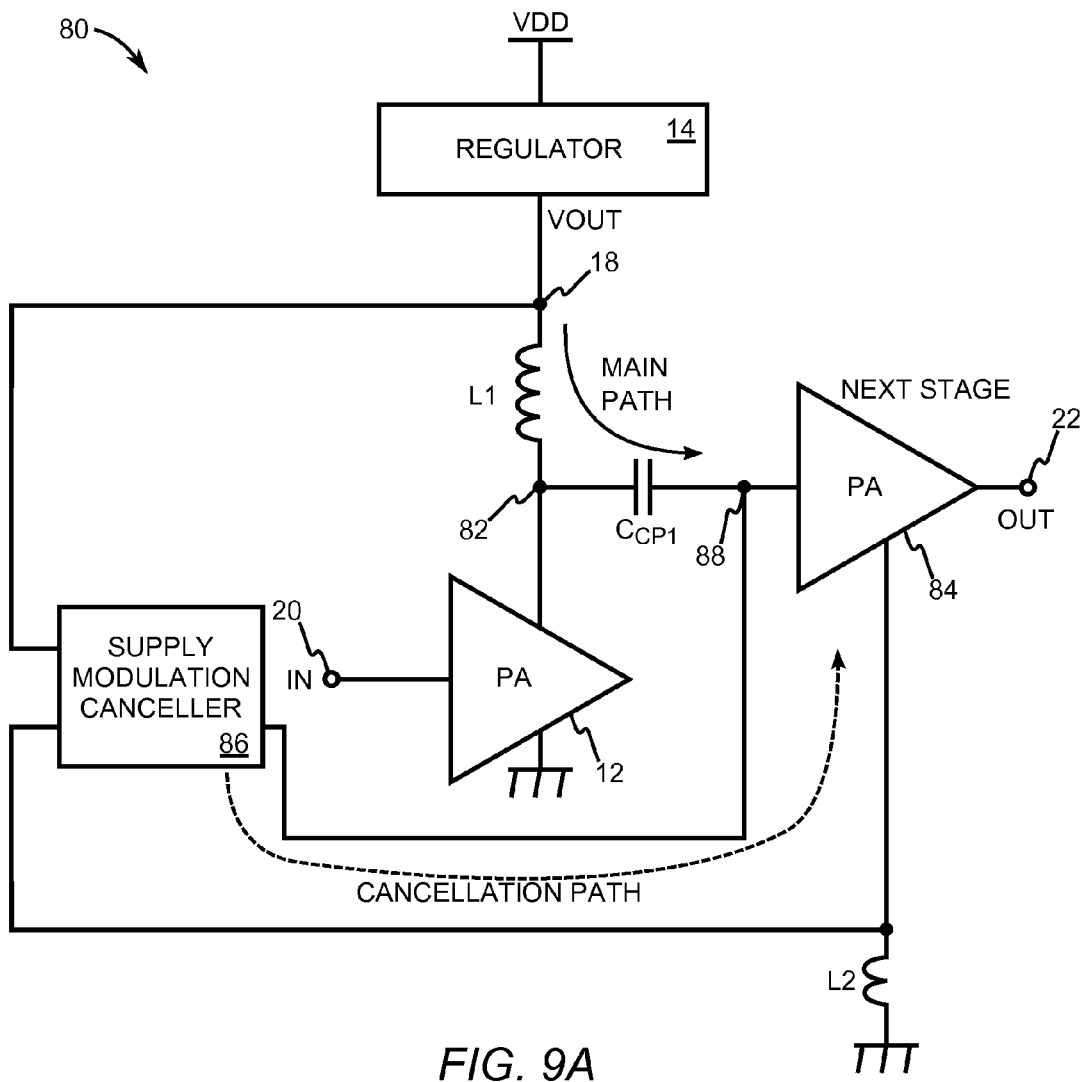
FIG. 9A is a schematic of a regulator and power amplifier system having an inductive power stage with a direct path from the supply regulator to an output through the inductor.

FIG. 9A is a schematic of a regulator and power amplifier system 80 having an inductive power stage that includes the power amplifier 12 with a direct path from the regulator 14 to an inductive stage output 82 through the inductor L1. Thus, any low frequency modulation change of the regulator output voltage VOUT will directly pass to the inductive stage output 82 and sum with a main signal path signal that is passed to a next stage PA 84 via the coupling capacitor $C_{CP1}$. This supply modulation leakage into the main signal path results in harmonic distortions.

Supply modulation canceller circuitry 86 provides a cancellation signal at a PA input node 88 between the coupling capacitor $C_{CP1}$ and the next stage PA 84. If the main supply modulation leakage current is extracted by a cancellation path before it reaches the next stage PA 84, then the supply modulation is effectively cancelled. The main advantage of this disclosure is that the supply modulation cancellation can tolerate relatively large regulator voltage modulation and thus the regulator can have a relatively lower power because the supply modulation is practically cancelled within a low power signal processing path that extends between the input 20 and the output 22. A second inductor L2 prevents the cancellation signal from being shorted to ground.

Figure 9B:
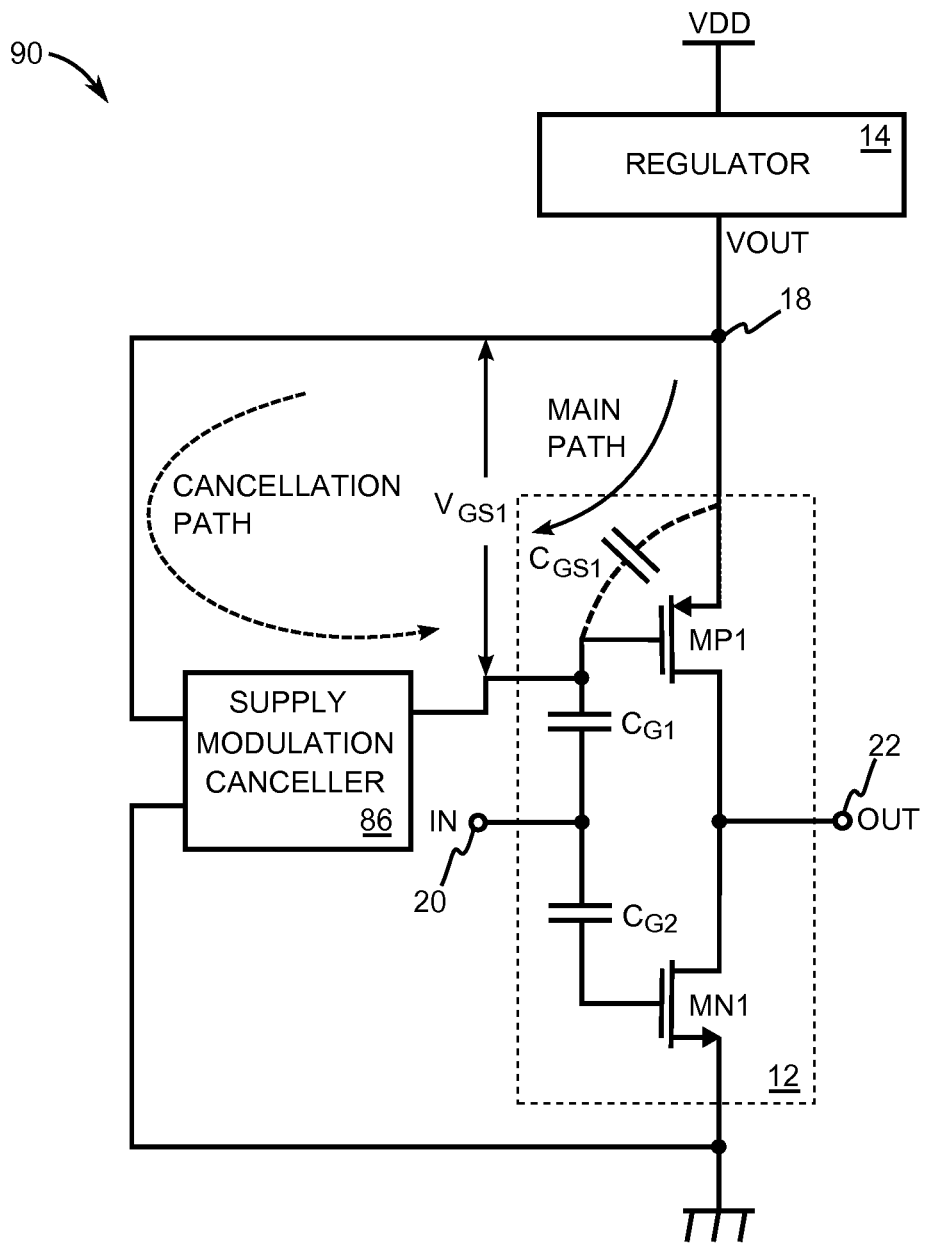
FIG. 9B is a schematic of a regulator and power amplifier system having a CMOS amplifier, wherein supply modulation leaks to an amplifier input through the gate to source capacitance of the CMOS amplifier's PFET device.

FIG. 9B depicts a CMOS amplifier where the regulator supply modulation leaks to the amplifier input through an intrinsic gate to source capacitance $C_{GS1}$ of the PFET device MP1. In this case, supply modulation canceller circuitry 86 is configured to inject a current into the gate of the PFET device MP1. The amount of current injected into the gate of PFET MP1 is adjusted by supply modulation canceller circuitry 86 such that the gate to source voltage $V_{GS1}$ does not have a component generated by supply modulation. As a result, supply modulation is not propagated through the output 22.

Figure 10A:
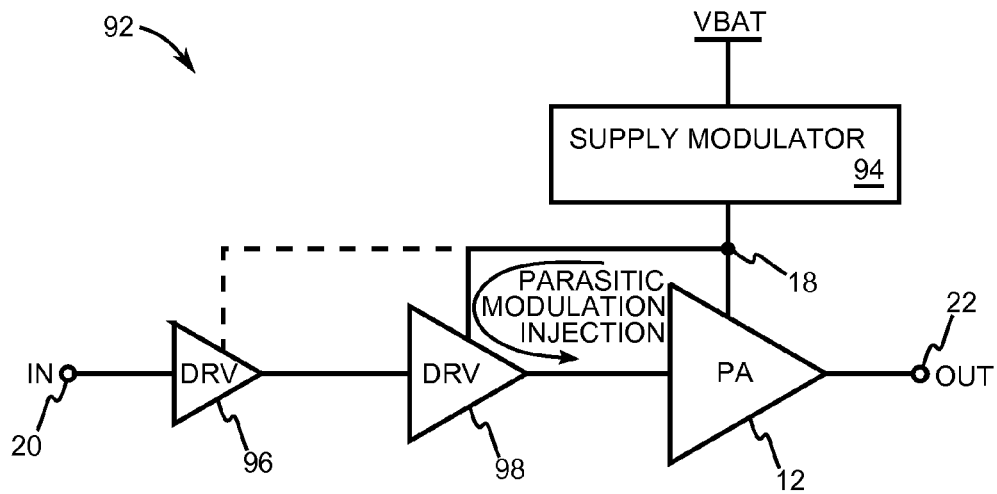
FIG. 10A is a schematic of a regulator and power amplifier system that is configured to provide a parasitic supply modulation current injection to reduce or cancel deleterious effects of supply modulation of a DC-to-DC converter and supply modulator for both envelope tracking (ET) and envelope elimination and restoration (EER).

FIG. 10A is a schematic of a regulator and power amplifier system 92 that is configured to provide a parasitic supply modulation injection to reduce or cancel deleterious effects of supply modulation of a DC-to-DC converter and supply modulator 94 for both envelope tracking (ET) and envelope elimination and restoration (EER). A first driver stage 96 and a second driver stage 98 are coupled in series to the power amplifier 12. In order to improve efficiency, the second driver stage 98 and optionally the first driver stage 96 can be coupled to the DC-to-DC converter and supply modulator 94. The DC-to-DC converter and supply modulator 94 supplies modulated power at baseband to make the power amplifier 12 more efficient. However, use of the DC to DC converter and supply modulator 94 results in unwanted supply or bias modulation in the power amplifier 12. Therefore, the parasitic supply modulation injection is provided to reduce or cancel deleterious effects of the supply modulation.

Figure 10B:
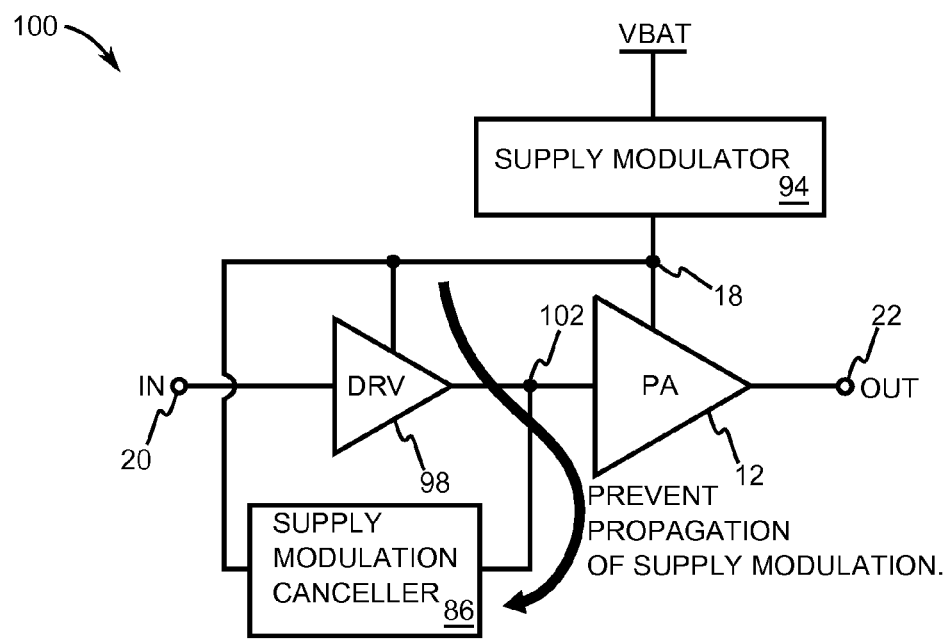
FIG. 10B is a schematic of a regulator and power amplifier system that includes supply modulation canceller circuitry that in some cases is more appropriate when the parasitic supply modulation current injection configuration of the embodiment of FIG. 10A is not sufficient.

FIG. 10B includes supply modulation canceller circuitry 86 that in some cases is more appropriate than parasitic supply modulation injection alone. Supply modulation canceller circuitry 86 provides a cancellation signal at an amplifier input node 102. As a result, the supply modulation is effectively cancelled.

Figure 11:
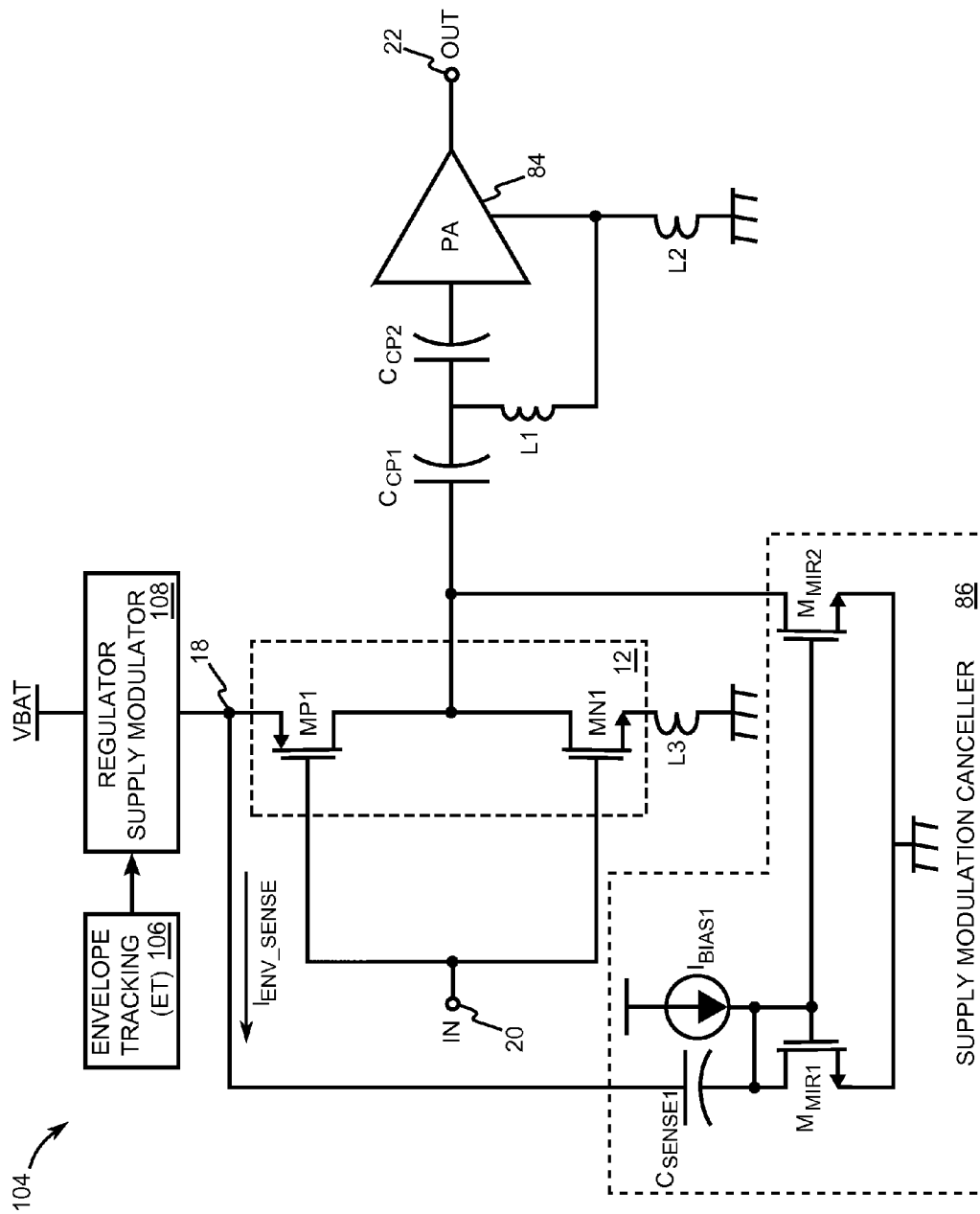
FIG. 11 is a schematic of a regulator and power amplifier system that is an exemplary embodiment that is also configured to reduce supply modulation generated in ET and EER systems.

FIG. 11 depicts an exemplary embodiment of supply modulation use in ET and EER power amplifier systems. Both input and output residual supply modulation cancellation can be used. In the exemplary regulator and power amplifier system 104 of FIG. 11, a transistorized level implementation for a CMOS amplifier is provided.

Figure 12:
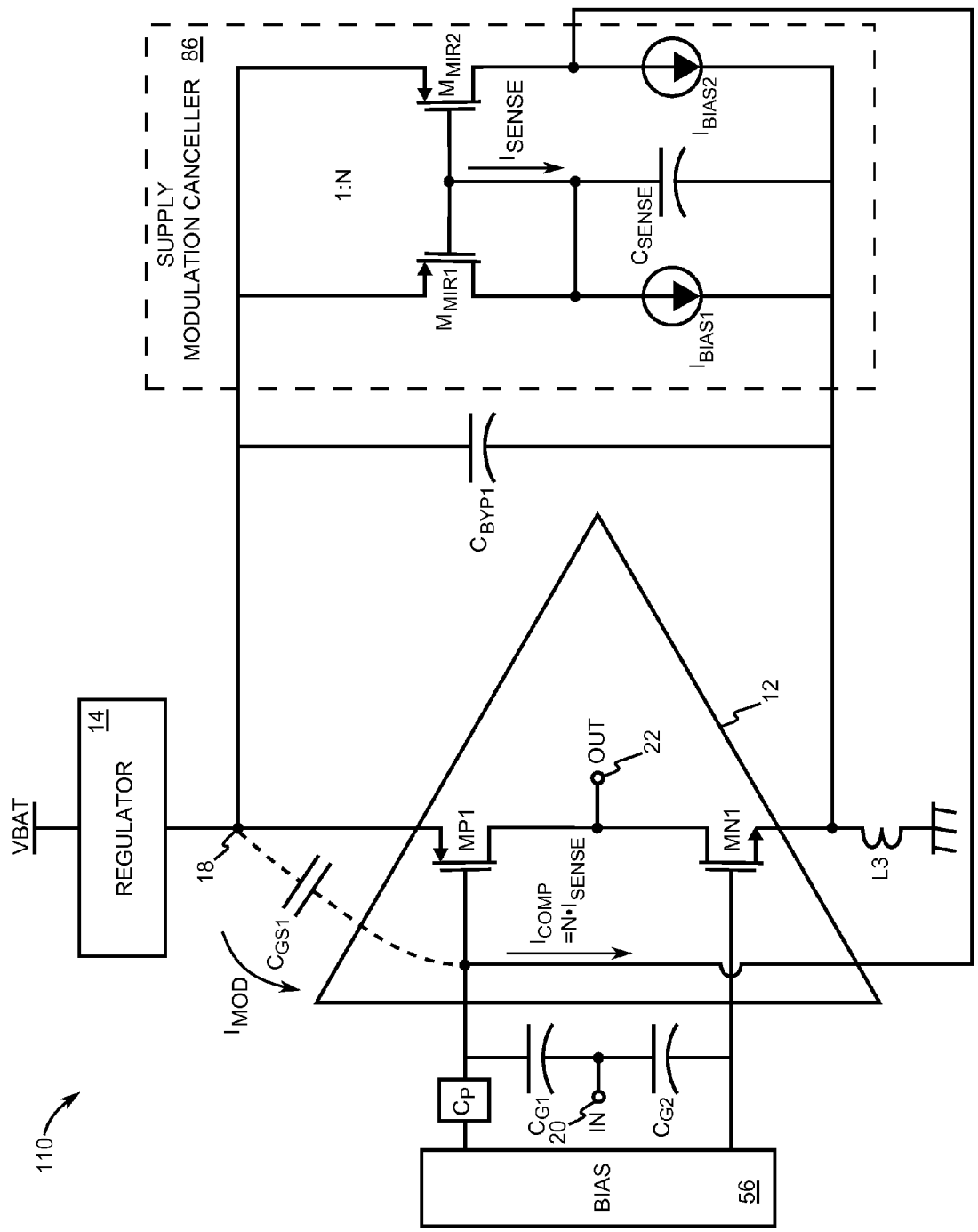
FIG. 12 is a schematic of a regulator and power amplifier system that is configured to sense supply modulation by a pre-biased current mirror that has a bypass capacitor.

FIG. 12 is a schematic of a regulator and power amplifier system 110 that is configured to sense supply modulation by a pre-biased current mirror that has a bypass capacitor $C_{BYP1}$.

Supply modulation is sensed by a pre-biased current mirror that in this particular case makes up the supply modulation canceller circuitry 86. The capacitor $C_{BYP1}$ is connected between the supply node 18 and ground via an inductor L3.

The sense current $I_{SENSE}$ is AC and is passed by a sense capacitor $C_{SENSE}$. The sense current $I_{SENSE}$ can be amplified by an optional current ratio N in the pre-biased mirror making up the supply modulation canceller circuitry 86. This allows the use of a capacitance value for the sensing capacitor that is N times smaller than an injection capacitance Cp for the power amplifier 12. As a result, die area and cost is reduced. If an emphasis on power saving is desired, N can be set equal to 1, and a $C_{SENSE}$ capacitance equal in size with the injection capacitance $C_p$ should be used.

A regulator supply modulation leakage current $I_{MOD}$ and a compensation current $I_{COMP}$ ($I_{COMP}=N*I_{SENSE}$) are cancelling each other, neutralizing the supply modulation leakage at the output 22 of the power amplifier 12. Therefore, even though the regulator 14 has bias modulation, it does not impact the power amplifier signal path between the input 20 and the output 22.

Figure 13:
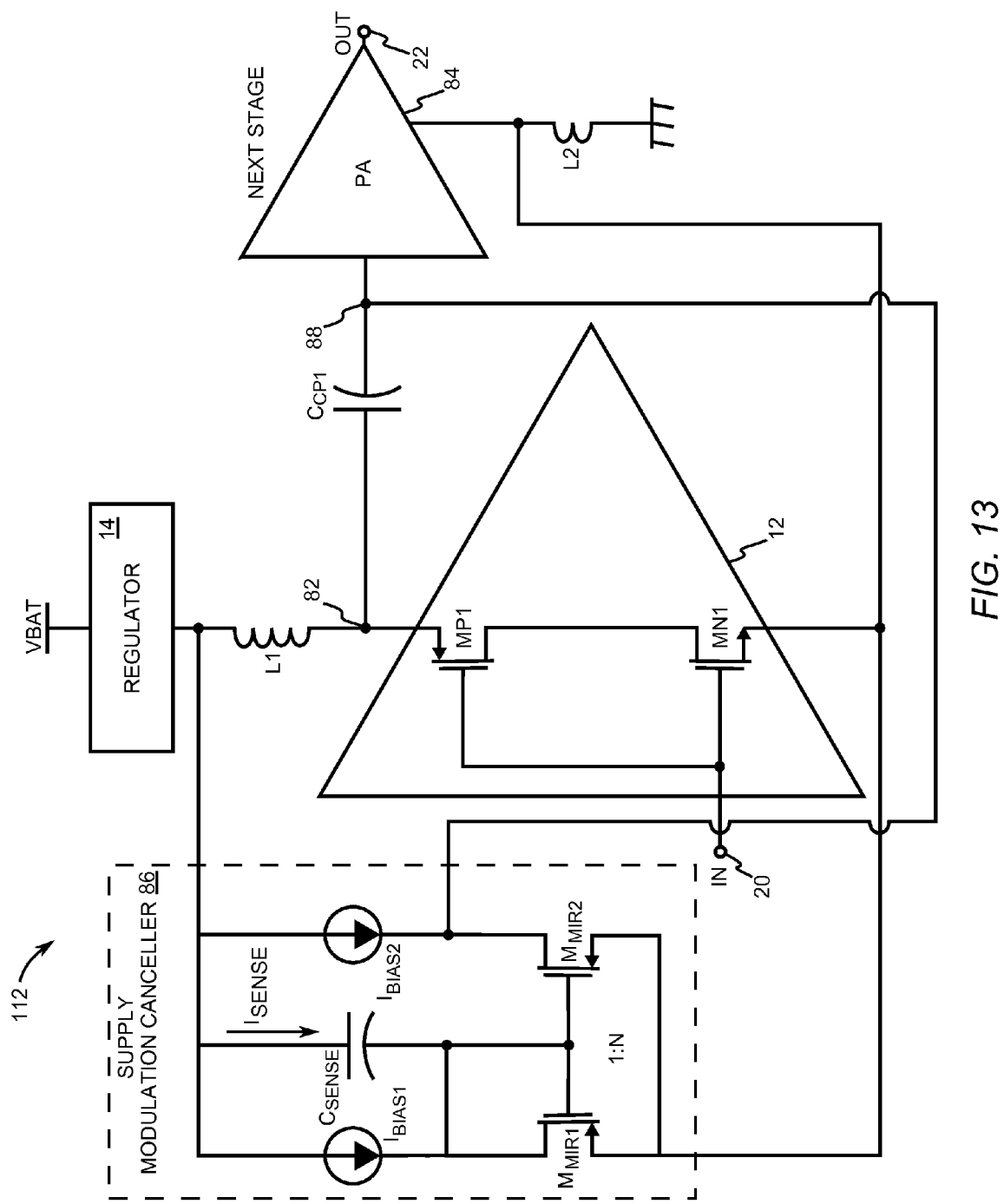
FIG. 13 is a schematic of a regulator and power amplifier system configured for reducing supply modulation effects in a high electron mobility field-effect transistor (HFET) amplifier using a drain inductive load.

FIG. 13 is a schematic of a regulator and power amplifier system 112 configured for reducing supply modulation effects in a high electron mobility field-effect transistor (HFET) amplifier using a drain inductive load. FIG. 13 represents an exemplary embodiment applied to the HFET amplifier using a drain inductive load. In this case, the supply modulation coming from the regulator 14 leaks directly to the inductive stage output 82 through the inductor L1. Thus, any low frequency modulation change of the regulator output voltage VOUT will directly pass to the inductive stage output 82 and sum with a main signal path signal that is passed to the next stage PA 84 via the coupling capacitor $C_{CP1}$. This supply modulation leakage into the main signal path results in harmonic distortions.

Supply modulation canceller circuitry 86 provides a cancellation signal at the next stage PA input node 88 between the coupling capacitor $C_{CP1}$ and the next stage PA 84. If the main supply modulation leakage current is extracted by a cancellation path before it reaches the next stage PA 84, then the supply modulation is effectively cancelled. Therefore, the cancellation needs to be done at the output.

The pre-biased current mirror making up the supply modulation canceller circuitry 86 senses the supply modulation with the sense capacitor $C_{SENSE}$ that from signal perspective is connected across the regulator 14. The sense capacitor $C_{SENSE}$ converts the modulated voltage into a sensed modulated current $I_{SENSE}$, which can be optionally amplified at the output of the supply modulation canceller circuitry 86, which in this case is coupled directly to the next stage PA input node 88.

By injecting the compensation current $I_{COMP}$ into the next stage PA input node 88, the regulator supply modulation leakage current $I_{MOD}$ leaking into the signal path is neutralized. The sensing current mirror made up of a first current source IBIAS1, a second current source IBIAS2, the first mirror device $M_{MIR1}$ and the second mirror device $M_{MIR2}$ is operated as Class A and always consumes DC current.

In standard regulators with low drop off voltage that use negative feedback to lower output impedance $Z_{OUT}$, the negative feedback is effective only within the closed loop system bandwidth. Closing locally RF current from a load circuit requires the use of a relatively large bypass capacitor $C_{BYP}$. This makes an internal compensation of the regulator more difficult and usually leads to larger regulator bias current at the given loop bandwidth value.

Figure 14:
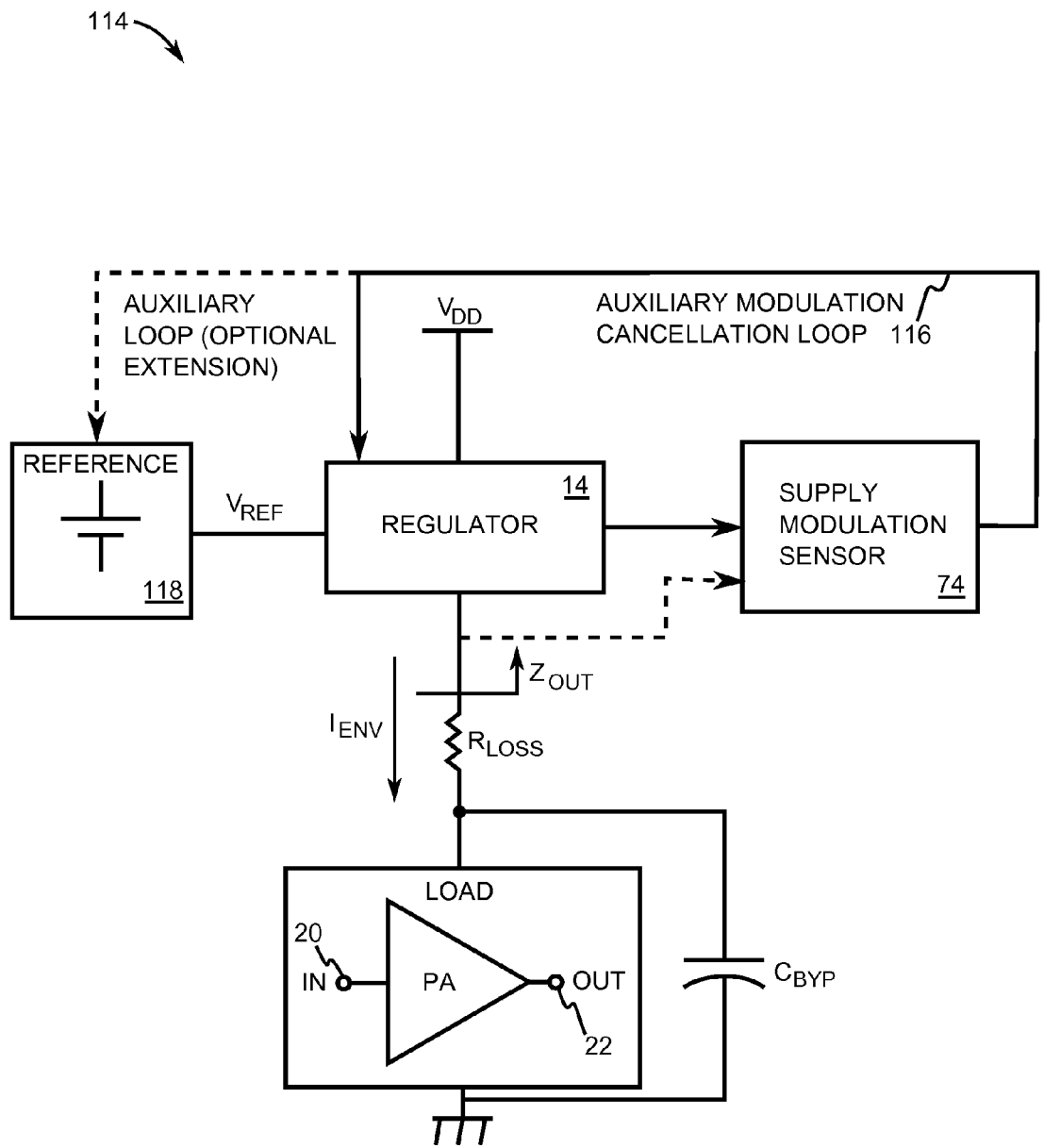
FIG. 14 is a schematic of a regulator and power amplifier system with a regulator using an auxiliary feedback loop to reduce an undesirable supply modulation generated by a large modulated load current passing through a series resistance.

FIG. 14 is a schematic of a regulator and power amplifier system 114 wherein the regulator 14 receives a compensation signal via an auxiliary modulation cancellation loop 116 to reduce an undesirable supply modulation generated by a large modulated load current passing through a series loss resistance $R_{LOSS}$. The disclosed technique to reduce the supply modulation due to the series loss resistance $R_{LOSS}$ and partially due to the regulator output impedance $Z_{OUT}$, which are passed by the modulated envelope current $I_{ENV}$, comprises adding to the relatively strong negative feedback, and auxiliary positive feedback loop that cancels at least partially the supply modulation.

The auxiliary loop first senses the supply modulation using a current or voltage mode technique and the end uses the envelope information to modulate the regulator's output voltage. The modulation can be formed at the reference voltage, (at the inverting amplifier input), in the feedback network (at the non-inverting amplifier input), at some internal mode of the amplifier, or at some combination of the above.

In order to perform the cancellation, the auxiliary modulation cancellation loop 116 needs to sense directly the amount of undesirable supply modulation voltage in a voltage mode or indirectly sense the amount of undesirable supply modulation voltage by sensing the envelope current $I_{ENV}$ in a current mode.

Once the supply modulation voltage is evaluated either directly or indirectly, the auxiliary modulation cancellation loop 116 will control one or more internal nodes of the regulator 14, which is used to determine the output voltage VOUT needed to move in the opposite direction of the supply modulation in order to cancel the supply modulation voltage. However, it is usually not possible to cancel completely all of the undesirable supply modulation from the regulator and power amplifier system 114 since this may result in too large a positive feedback loop gain, and thus to instability. However, on the order of 50% to 80% of the undesirable supply modulation throughout the regulator and power amplifier system 114 can be cancelled using this method. The cancellation voltage can be applied either at a voltage reference 118 or at an alternate internal node (not shown) of the regulator 14.

Figure 15A:
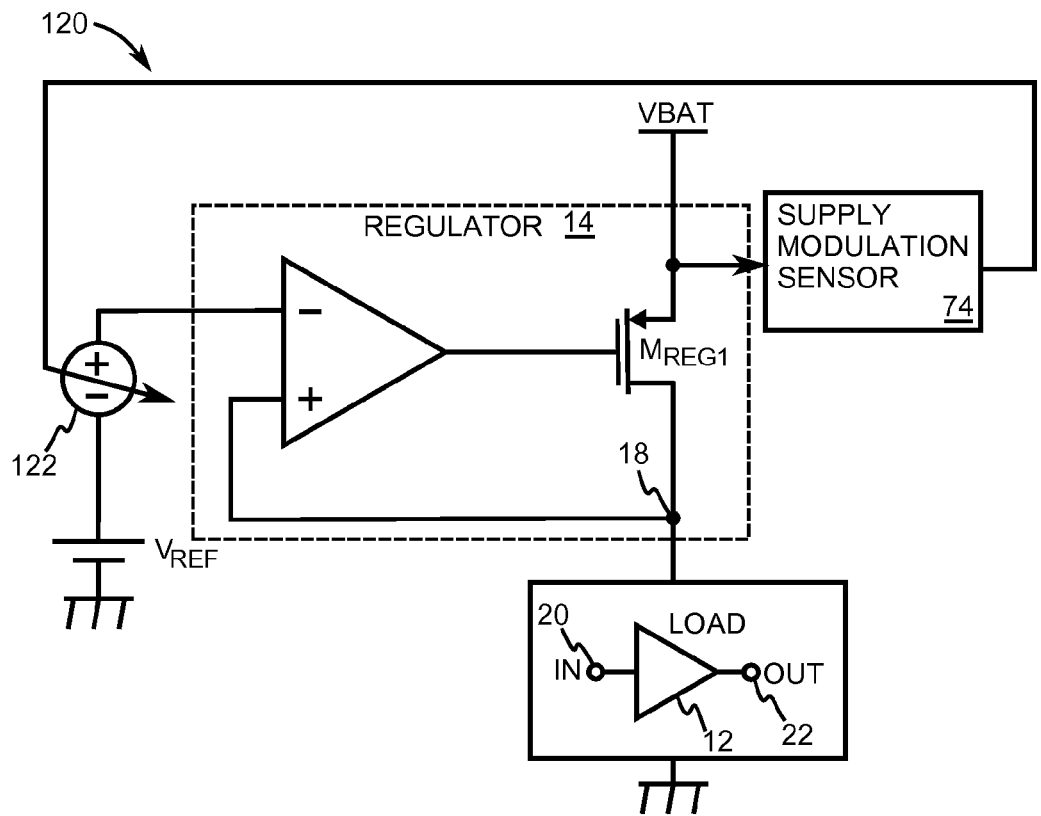
FIG. 15A is a schematic of a regulator and power amplifier system configured to apply a supply modulation cancellation signal in series with an input reference voltage.

FIG. 15A is a schematic of a regulator and power amplifier system 120 configured to apply a supply modulation cancellation signal in series with the voltage reference 122. In this case, the regulator bandwidth is relatively much larger than the signal bandwidth. As such, a modulation cancellation voltage can be passed to the output of the regulator 14 without generating a slow settling tail, which leads to distortion. This embodiment is the simplest in most cases since this embodiment can directly use the envelope current $I_{ENV}$ sensed in an output device $M_{REG1}$ of the regulator 14.

Figure 15B:
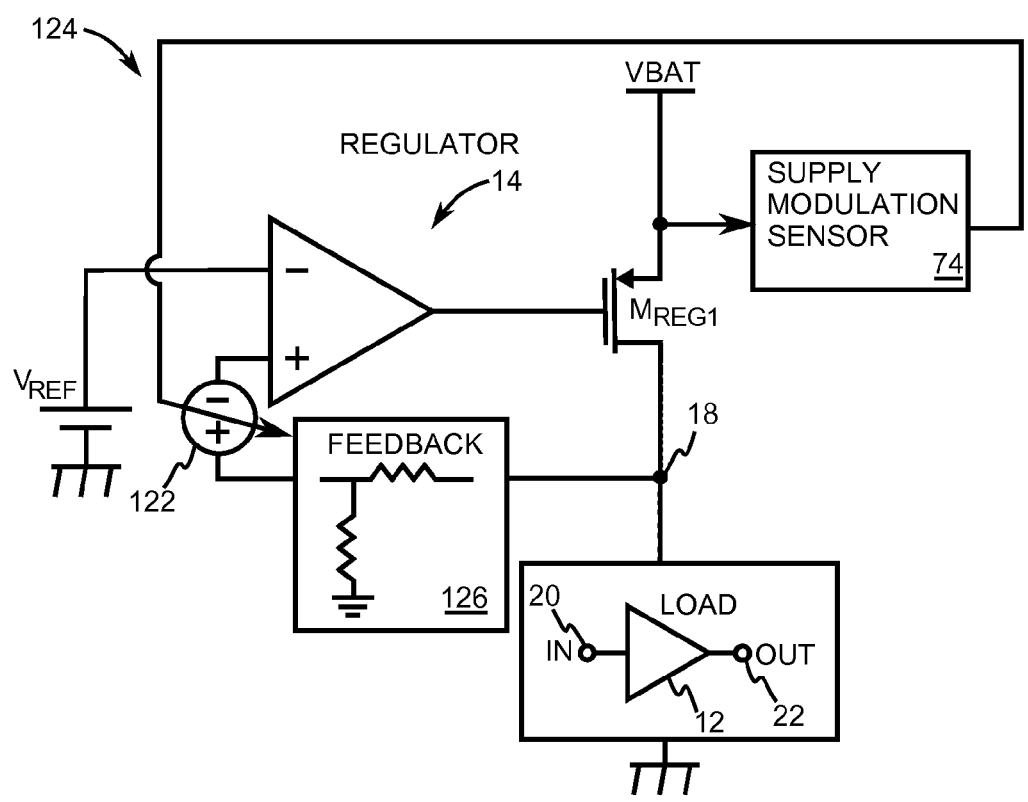
FIG. 15B is a schematic of a regulator and power amplifier system configured to practically cancel undesirable supply modulation via a feedback path.

FIG. 15B is a schematic of a regulator and power amplifier system 124 configured to practically cancel undesirable supply modulation via a feedback path 126. In such a case, a signal inversion may be needed in order to perform the cancellation of undesirable supply modulation. One advantage of this technique is that it avoids slow time constants from a reference path that is usually used for noise filtering.

Figure 16:
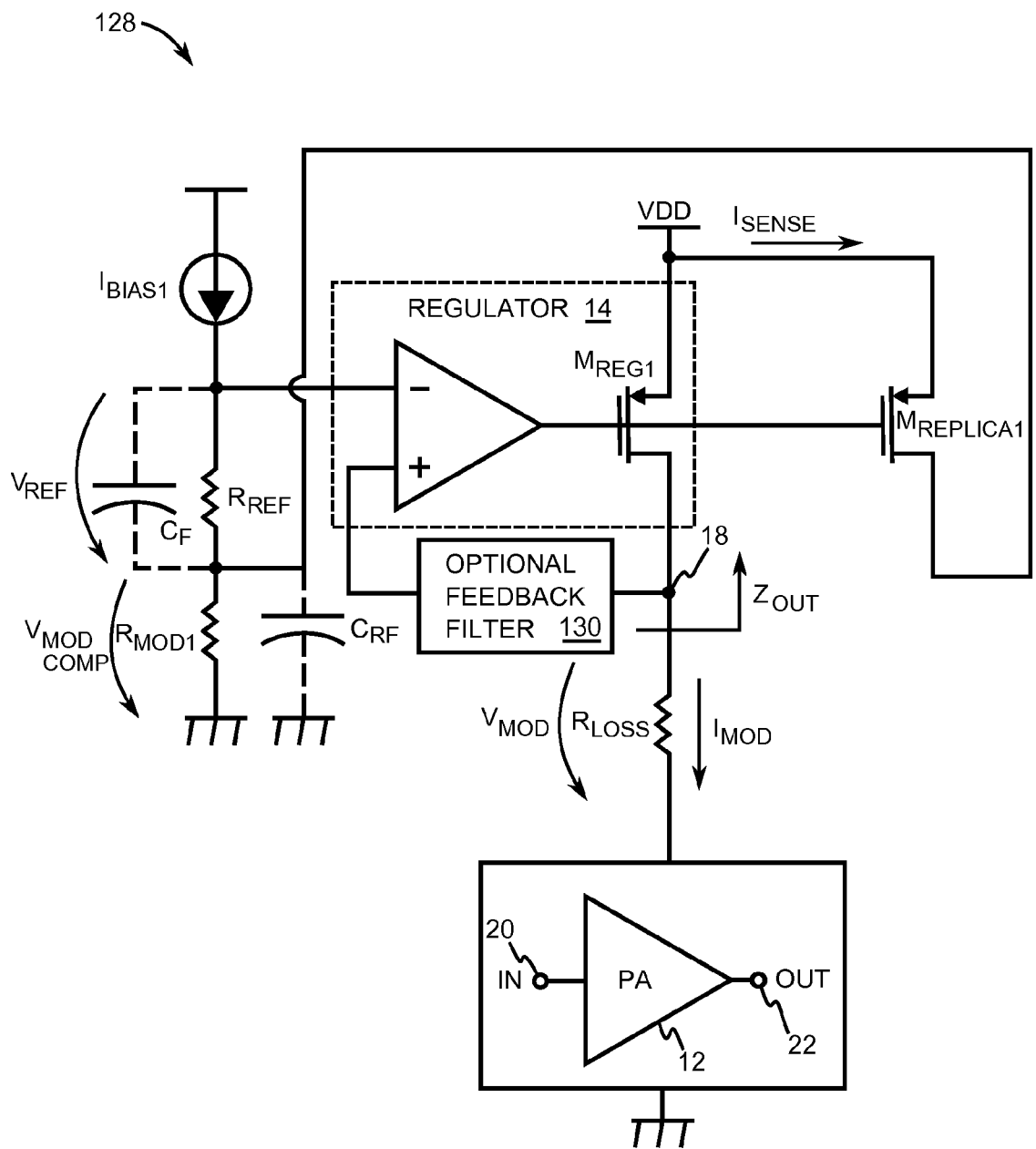
FIG. 16 is a schematic of a regulator and power amplifier system that includes an exemplary first transistor level for the auxiliary positive feedback loop for practically canceling various supply modulations within the regulator and power amplifier system.

FIG. 16 is a schematic of a regulator and power amplifier system 128 that includes an exemplary first transistor level for the auxiliary positive feedback loop for practically canceling various supply modulations within the regulator and power amplifier system 128. The load modulated signal is sensed with a small replica device $M_{REPLICA1}$ of the regulator's output device $M_{REG1}$. The $I_{SENSE}=\alpha*I_{ENV}$ sensed envelope current is injected into a cancelling resistor $R_{MOD1}$ connected in series with reference voltage $V_{REF}$ generation circuitry made up of $I_{BIAS1}$ and $R_{REF1}$. The cancellation voltage $V_{MOD\_COMP} = I_{SENSE} * R_{MOD1} = \alpha * I_{ENV} * R_{MOD1}$ is designed to cancel the $V_{MOD} = I_{ENV} * R_{LOSS}$ modulation voltage as well as a portion of the supply modulation due to the output impedance $Z_{OUT}$ of the regulator 14.

A filtering capacitor $C_{RF}$ may be used to eliminate the RF component of the supply modulation cancellation voltage $V_{MOD\_COMP}$. The main advantage of this technique is simplicity of only needing three components $M_{REPLICA1}$, $R_{MOD1}$, and $C_{RF1}$. This embodiment still requires that bandwidth of the regulator 14 is relatively larger than signal modulation bandwidth.

Figure 17:
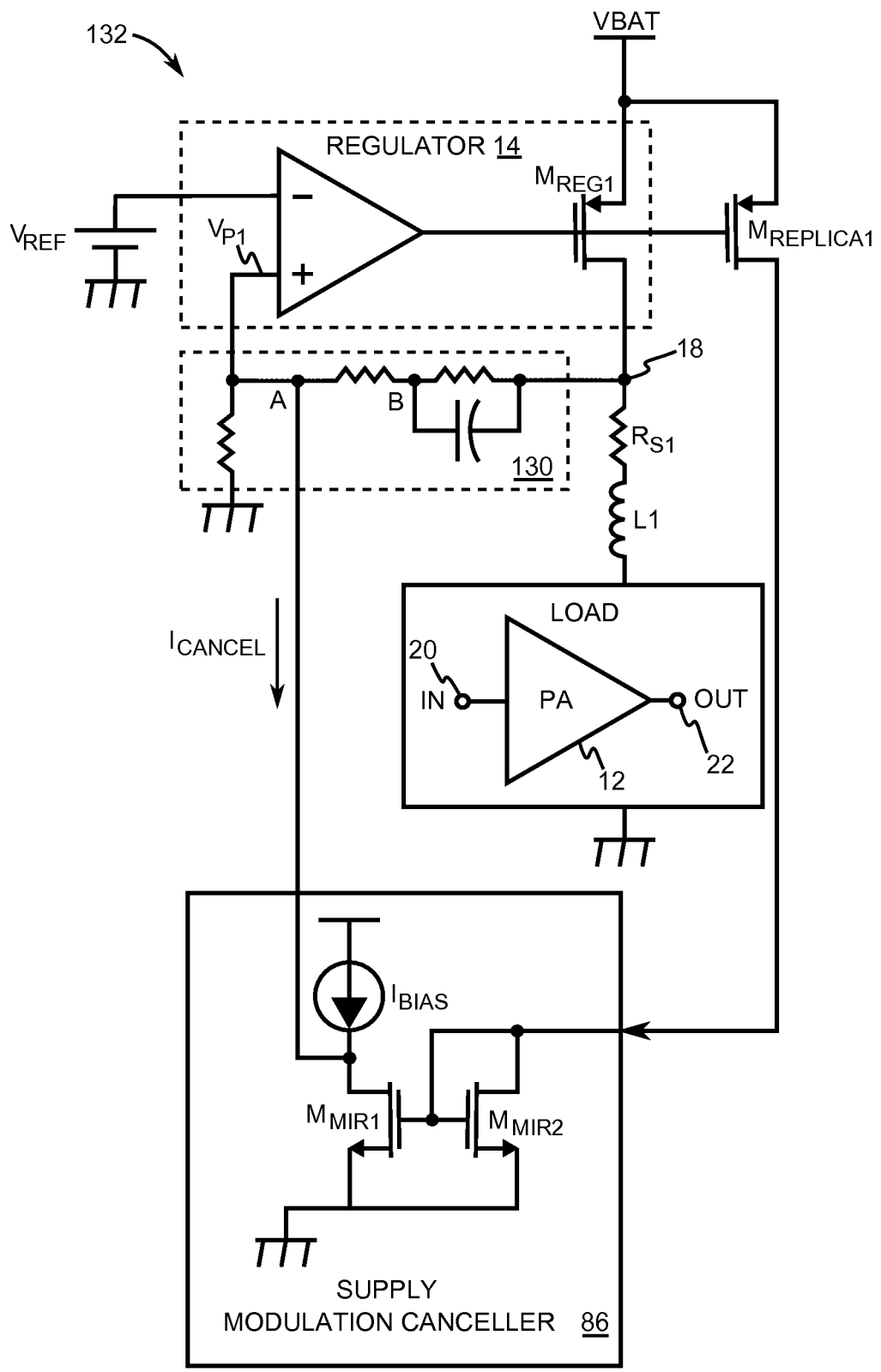
FIG. 17 is a schematic of a regulator and power amplifier system configured to provide series supply modulation cancellation using injection of a sensed envelope signal into a feedback network.

FIG. 17 is a schematic of a regulator and power amplifier system 132 that is configured to provide a series supply modulation cancellation using an injection of the sensed envelope signal into a feedback network 130. Since the gain from a feedback input $V_{P1}$ of the amplifier to the supply node 18 is negative/inverting, the sensed envelope current needs to be inverted before injecting it into the feedback network. One example of the inversion circuit is using a direct current $I_{DC}$ from which the sensed current $I_{SENSE}$ is subtracted.

A cancellation current $I_{CANCEL}$ can be injected at different nodes such as node A and node B in the feedback network 130. The DC offset created by such an arrangement needs to be taken into account when designing the feedback network 130 for a given set of output regulated and reference voltages.

One possible situation is when the signal modulation bandwidth is large (e.g., Wideband Code Division Multiple Access (WCDMA), High-Speed Uplink Packet Access (HSUPA), Long Term Evolution (LTE) signals) and the realizable bandwidth of the regulator 14 in a given power budget cannot be made much larger than the signal bandwidth (e.g., at least 2 to 4 times larger). In this case, if the RF modulation cancellation is applied at the reference voltage $V_{REF}$, the RF modulation cancellation will have a settling tail when passing through the regulator 14 provided that the feedback network 130 is allowed to settle on its own.

Figure 18:
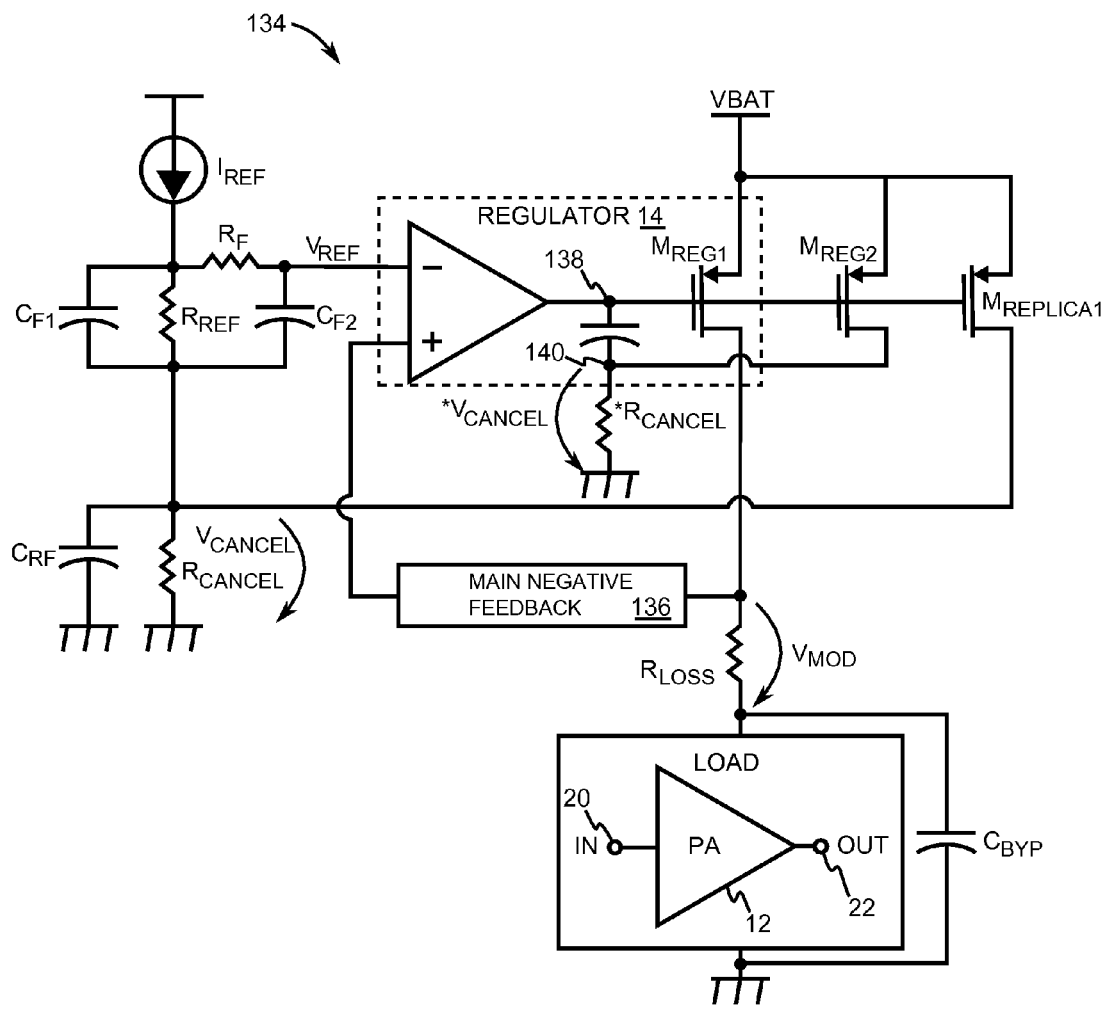
FIG. 18 is a schematic of a regulator and power amplifier system configured to provide substantial cancellation of supply modulation in the case of a regulator that does not have a large bandwidth.

FIG. 18 is a schematic of a regulator and power amplifier system 134 configured to provide substantial cancellation of supply modulation in the case that the regulator 14 does not have an appropriately large bandwidth. To help eliminate the slow settling tail of a main negative feedback loop 136, in addition to modulating the reference voltage $V_{REF}$, slow swing nodes 138 and 140 in the regulator 14 may also be modulated with additional replicas of the envelope current $I_{ENV}$. An injected current needs to be assigned in accordance to a given gain at the point of injection. In this way, the slow swing nodes 138 and 140 are modulated simultaneously, and thus no long tail results due to the insufficient regulators loop bandwidth. It should also be understood that $*V_{CANCEL}$ and $*R_{CANCEL}$ have practically equal values to $V_{CANCEL}$ and $R_{CANCEL}$.

Another concern regarding use of an auxiliary compensation loop such as the auxiliary modulation cancellation loop 116 (FIG. 14) is avoiding overcompensation in a case when the output device $M_{REG1}$ goes into triode mode due to insufficient supply voltage headroom. If the output device $M_{REG1}$ is going into triode operation, while the replica device $M_{REPLICA1}$ remains in saturation operation, the current mirror can be significantly altered, potentially resulting in overcompensation, or even instability.

Figure 19A:
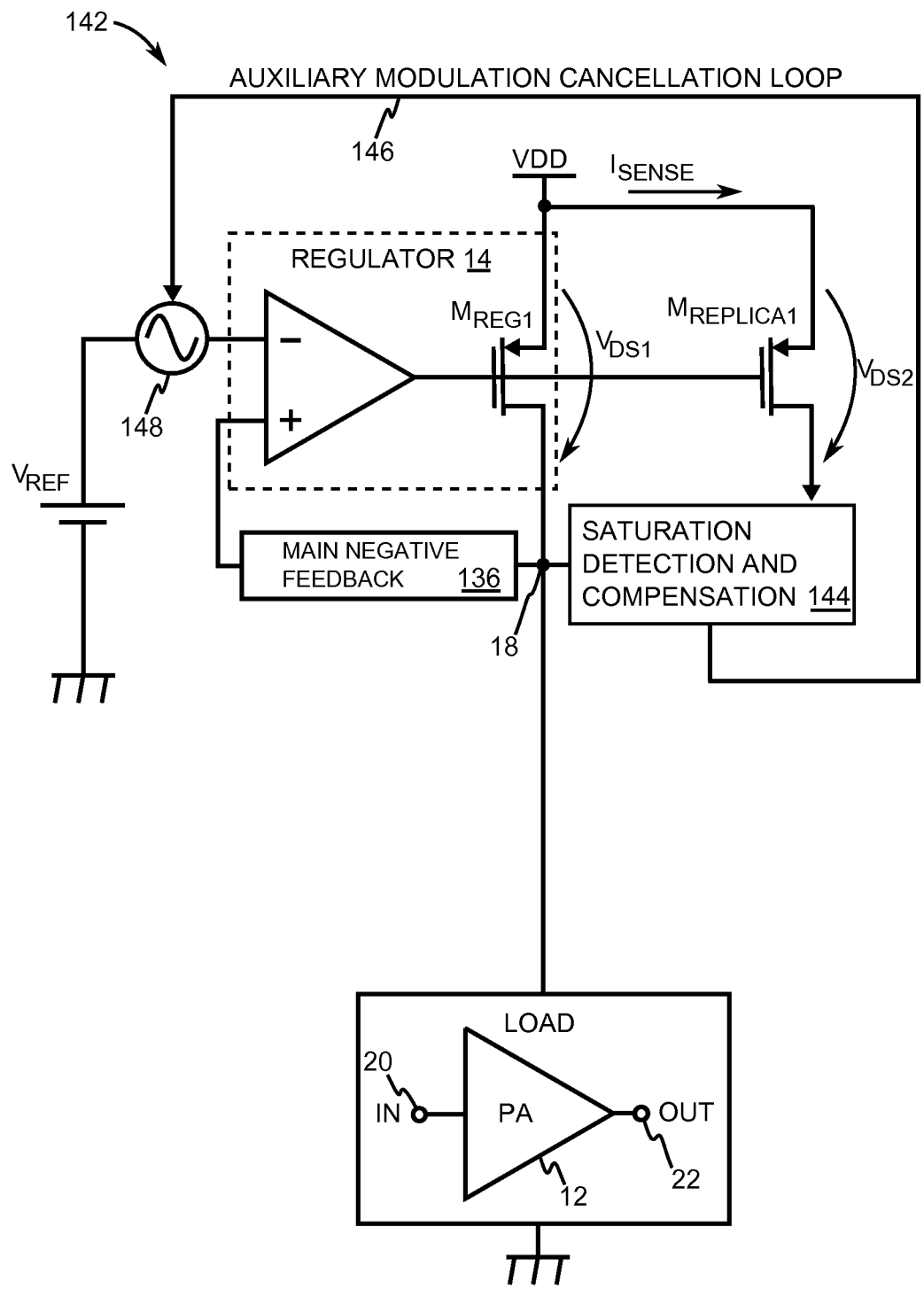
FIG. 19A is a schematic of a regulator and power amplifier system having a saturation detection and compensation circuit that maintains a constant current mirror gain even when the output device of the regulator begins entering a triode operating region.

FIG. 19A is a schematic of a regulator and power amplifier system 142 having a saturation detection and compensation circuit 144 that maintains a constant current mirror gain even when the output device $M_{REG1}$ of the regulator 14 begins entering a triode operating region. An auxiliary modulation cancellation loop 146 feeds a supply voltage compensation signal back to a reference voltage summation node circuit 148 that outputs the reference voltage $V_{REF}$ along with a supply voltage cancellation signal to the regulator 14.

Figure 19B:
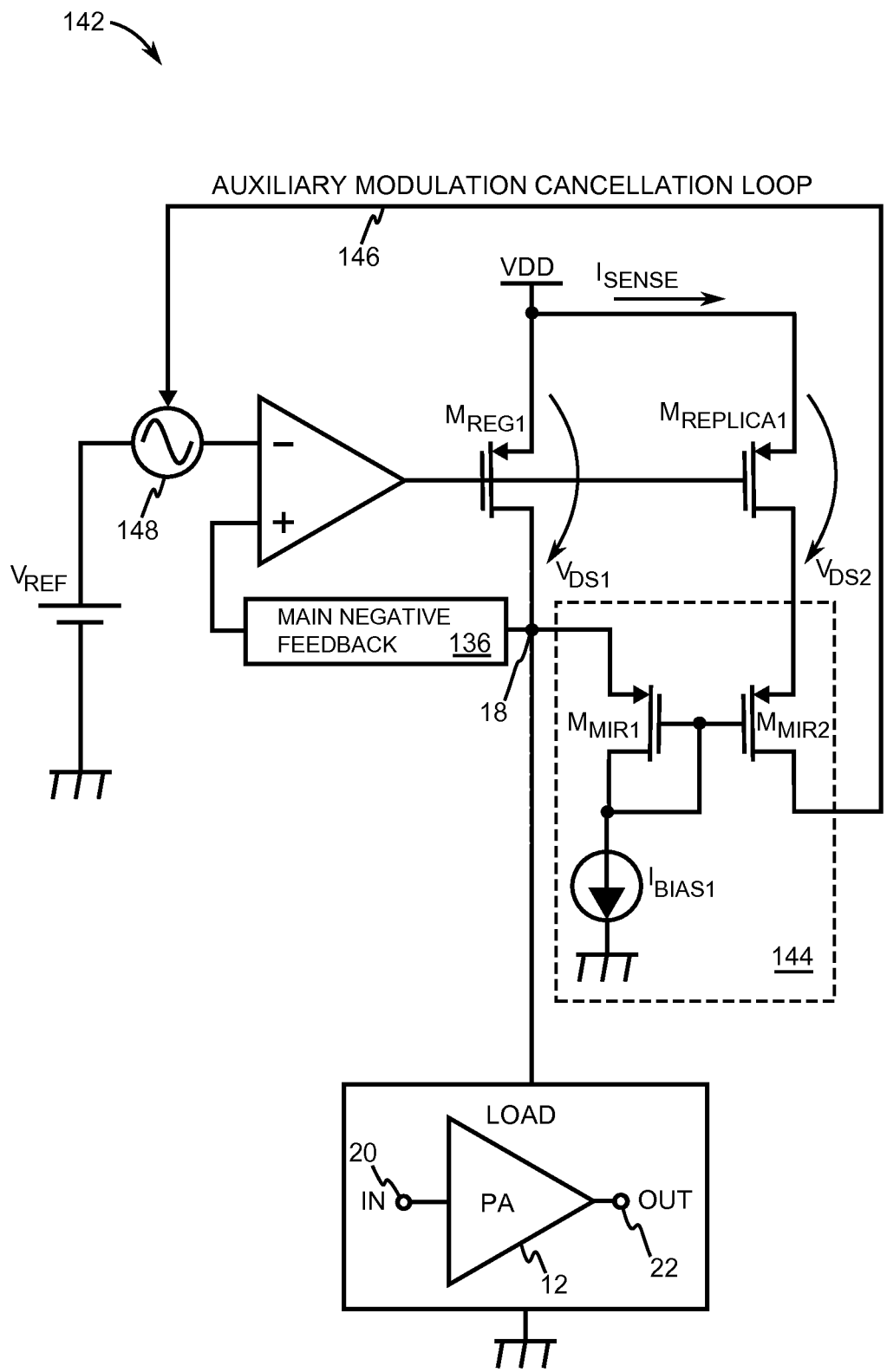
FIG. 19B is a schematic of the regulator and power amplifier system of FIG. 19A that provides an exemplary embodiment of the saturation detection and compensation circuit.

FIG. 19B is a schematic of the regulator and power amplifier system 142 that provides an exemplary embodiment of the saturation detection and compensation circuit 144. In this exemplary embodiment, a PFET current mirror made up of $I_{BIAS1}$, $M_{MIR1}$ and $M_{MIR2}$ ensures that the drain-to-source voltage $V_{DS1}$ of $M_{REG1}$ and $V_{DS2}$ of $M_{REPLICA1}$ are kept equal, regardless of an operating regime such as saturated operation or triode operation.

Those skilled in the art will recognize improvements and modifications to the embodiments of the present disclosure. All such improvements and modifications are considered within the scope of the concepts disclosed herein and the claims that follow.

What is claimed is:

1. A power amplifier system comprising:
a regulator having an unregulated input and a regulated output;
a power amplifier having a supply input for receiving a supply current from the regulated output and having a signal input and a signal output that comprise a main signal path; and
supply modulation mitigation circuitry adapted to sense a supply modulation signal output from the regulator, generate a cancellation signal that is a scaled inverse of the supply modulation signal, and inject the cancellation signal into a node within the power amplifier system to sum the supply modulation signal and cancellation signal together to reduce the supply modulation signal from within the main signal path, wherein the supply modulation mitigation circuitry comprises an envelope signal sensor adapted to sense an envelope tracking signal and a current mirror that is adapted to correspond with the envelope signal sensor and inject an envelope current into a terminal of the power amplifier, wherein the envelope current is proportional to the envelope tracking signal.

2. The power amplifier system of claim 1 further including a load inductor coupled to the signal output and a voltage reference coupled to a reference input of the regulator, wherein the supply modulation mitigation circuitry is further adapted to modulate a reference voltage provided by the voltage reference in order to reduce power amplifier bias voltage modulation generated by current flowing through a winding resistance of the load inductor.

3. The power amplifier system of claim 1 wherein the power amplifier includes an NFET device and a PFET device having gate terminals coupled to a common input and drain terminals coupled to a common output along with a source terminal of the PFET device coupled to the supply input and a source terminal of the NFET device communicatively coupled to a common node.

4. The power amplifier system of claim 3 wherein a portion of the supply modulation signal is passed to the NFET device and the PFET device via AC coupling between the regulated output of the regulator and the common input to the NFET device and the PFET device.

5. The power amplifier system of claim 1 wherein the power amplifier comprises CMOS technology.

6. The power amplifier system of claim 1 wherein the power amplifier comprises NMOS technology.

7. The power amplifier system of claim 1 wherein the supply modulation signal is proportional to an envelope tracking signal.

8. The power amplifier system of claim 1 wherein the terminal of the power amplifier is the supply input.

9. The power amplifier system of claim 1 wherein the terminal of the power amplifier is the signal input.

10. The power amplifier system of claim 1 wherein the terminal of the power amplifier is the signal output.

11. The power amplifier system of claim 10 wherein the envelope signal sensor is adapted to sense envelope current flowing through an NFET device having a drain coupled to the signal output.

12. The power amplifier system of claim 10 wherein the envelope signal sensor is adapted to sense envelope current flowing through a PFET device having a drain coupled to the signal output.

13. The power amplifier system of claim 1 wherein the envelope signal sensor is adapted for class A operation.

14. The power amplifier system of claim 1 wherein the envelope signal sensor is adapted for class B operation.

15. The power amplifier system of claim 1 wherein the envelope signal sensor is adapted for class AB operation.

16. The power amplifier system of claim 1 wherein the envelope signal sensor is adapted for class C operation.

17. The power amplifier system of claim 1 wherein the supply modulation mitigation circuitry is further adapted to inject a sensed envelope signal into the main signal path of the power amplifier to provide a common mode rejection of the supply modulation signal.

18. A power amplifier system comprising:
a regulator having an unregulated input and a regulated output;
a power amplifier having a supply input for receiving a supply current from the regulated output and having a signal input and a signal output that comprise a main signal path; and
supply modulation mitigation circuitry adapted to sense a parasitic supply modulation signal, and having a cancellation loop adapted to reduce the parasitic supply modulation signal in the main signal path, wherein the parasitic supply modulation signal is generated by the supply current flowing through a series resistance to a common node, wherein the supply modulation mitigation circuitry is adapted to inject a compensation signal in a plurality of terminals to improve bandwidth of the regulator.

19. The power amplifier system of claim 18 wherein the cancellation loop is adapted to inject the compensation signal into at least one terminal of the power amplifier, wherein the compensation signal is proportional to the parasitic supply modulation signal.

20. The power amplifier system of claim 19 wherein the at least one terminal of the power amplifier is the supply input.

21. The power amplifier system of claim 19 wherein the at least one terminal of the power amplifier is the signal input.

22. The power amplifier system of claim 19 wherein the at least one terminal of the power amplifier is the signal output.

23. The power amplifier system of claim 19 wherein the at least one terminal is an internal node.

24. The power amplifier system of claim 19 further including a voltage reference coupled to a voltage reference input of the regulator, and wherein the compensation signal is injected into the voltage reference input of the regulator.

25. The power amplifier system of claim 19 further including a feedback network adapted to mitigate the parasitic supply modulation signal, wherein the compensation signal is injected into the feedback network.

26. The power amplifier system of claim 19 further including saturation protection circuitry adapted to prevent saturation of the power amplifier during triode operation of the regulator.

27. The power amplifier system of claim 19 wherein the compensation signal is a current signal.

28. The power amplifier system of claim 19 wherein the compensation signal is a voltage signal.

* * * * *